(12) United States Patent
Ishimatsu et al.

(10) Patent No.: US 6,898,110 B2
(45) Date of Patent: May 24, 2005

(54) SEMICONDUCTOR INTEGRATED CIRCUIT DEVICE

(75) Inventors: Manabu Ishimatsu, Fukuoka (JP); Yoshihiko Inoue, Chikushino (JP); Hiroshi Yoshioka, Shima (JP); Masahito Suzuki, Tokyo (JP)

(73) Assignees: Hitachi, Ltd., Tokyo (JP); Hitachi ULSI Systems Co. Ltd., Tokyo (JP)

( * ) Notice: Subject to any disclaimer, the term of this patent is extended or adjusted under 35 U.S.C. 154(b) by 4 days.

(21) Appl. No.: 10/416,717
(22) PCT Filed: Oct. 19, 2001
(86) PCT No.: PCT/JP01/09203
§ 371 (c)(1), (2), (4) Date: May 14, 2003
(87) PCT Pub. No.: WO02/061839
PCT Pub. Date: Aug. 8, 2002

(65) Prior Publication Data
US 2004/0026716 A1 Feb. 12, 2004

(30) Foreign Application Priority Data
Jan. 31, 2001 (JP) ........................................ 2001-022754

(51) Int. Cl.[7] ................................................ G11C 5/06
(52) U.S. Cl. ........................ 365/149; 365/63; 365/200; 365/226
(58) Field of Search ........................... 365/149, 63, 200, 365/226

(56) References Cited

U.S. PATENT DOCUMENTS

| 5,754,467 | A | * | 5/1998 | Ikeda et al. | 365/154 |
| 5,867,440 | A | * | 2/1999 | Hidaka | 365/226 |
| 6,031,779 | A | * | 2/2000 | Takahashi et al. | 365/226 |
| 6,240,006 | B1 | * | 5/2001 | Kawasaki | 365/63 |
| 6,317,353 | B1 | * | 11/2001 | Ikeda et al. | 365/63 |

FOREIGN PATENT DOCUMENTS

| JP | 11-354745 | 6/1998 |
| JP | 2000-323672 | 5/1999 |

OTHER PUBLICATIONS

International Search Report from the Japanese Patent Office dated Jan. 15, 2002 for PCT/JP01/09203.

* cited by examiner

Primary Examiner—Richard Elms
Assistant Examiner—J. H. Hur
(74) Attorney, Agent, or Firm—Reed Smith LLP; Stanley P. Fisher, Esq.; Juan Carlos A. Marquez, Esq.

(57) ABSTRACT

In a device including regular circuits and redundant circuits, a plurality of relievable first wiring lines and a plurality of irrelievable second wiring lines are arranged in the same wiring layer as what constitutes the regular circuits and in the same direction, and at the same time the irrelievable wiring lines are arranged adjoining one another.

24 Claims, 16 Drawing Sheets

FIG. 10A
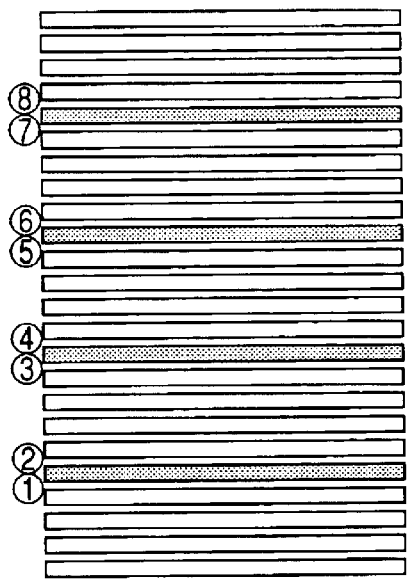
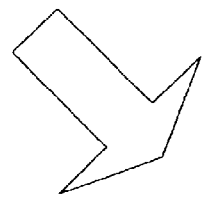
FIG. 10B
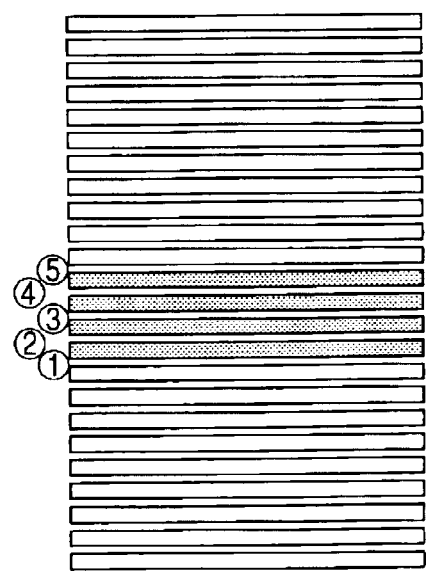

SEMICONDUCTOR INTEGRATED CIRCUIT DEVICE

TECHNICAL FIELD

The present invention relates to a semiconductor integrated circuit device, and more particularly to a technique which can be effectively applied to a semiconductor memory circuit having a large storage capacity, provided with redundant circuits for relieving faulty word lines and/or bit lines.

BACKGROUND ART

The redundancy technique (fault relieving technique) is extensively used as a useful means to increase the yield and to reduce the manufacturing cost of semiconductor memories. It is a method by which a small number each of redundant word lines and redundant bit lines are provided in advance to substitute for any faulty word lines and faulty bit lines, respectively, that may be found. To store the addresses of faulty word lines and faulty bit lines, a programmable element (fuses are used usually), into which faulty addresses detected by inspection are to be registered, is provided on the chip. In accessing the memory, the demanded address and the registered faulty address are compared and, if they are founded identical, a reserve word line or a reserve bit line is selected or, if not, the regular word line or the regular bit line is selected.

In a hierarchical word line system in which word lines comprise main word lines and sub-word lines, a plurality of sub-word lines are allocated for each main word line. For the selection of one sub-word line out of the plurality of sub-word lines allocated for one main word line, a sub-word line selection line is provided. For this reason, there is some allowance in the wiring pitch of the main word lines on the memory array, and it is conceivable to arrange the sub-word line selection line or a power supply line by utilizing the wiring layer in which the main word lines are formed. However, if a short circuiting fault arises between the main word lines, sub-word line selection line and power supply line, short circuiting between the main word lines could be relieved by replacing them with reserve main word lines. However, if a short circuiting fault occurs on the sub-word line selection line or the power supply line, it will constitute a D.C. fault or a function fault, which is irrelievable, and therefore the chip itself will become faulty.

Therefore, an object of the present invention is to provide a semiconductor integrated circuit device which is made less susceptible to faults while seeking a higher level of integration in a simple structure. This and other objects and novel features of the invention will become apparent from the description in this specification and drawings appended hereto.

DISCLOSURE OF THE INVENTION

A typical aspect of the invention disclosed in this application will be briefly described below. Thus, there are provided regular circuits and redundant circuits and, while a plurality of relievable first wiring lines and a plurality of irrelievable second wiring lines together constituting the regular circuits are arranged on the same wiring layer in the same direction, the irrelievable lines are arranged adjoining one another.

BRIEF DESCRIPTION OF THE DRAWINGS

FIGS. 10 show a wiring arrangement for describing the invention;

BEST MODES FOR CARRYING OUT THE INVENTION

To describe the present invention in further detail, it will be explained with reference to accompanying drawings.

Figure 1:
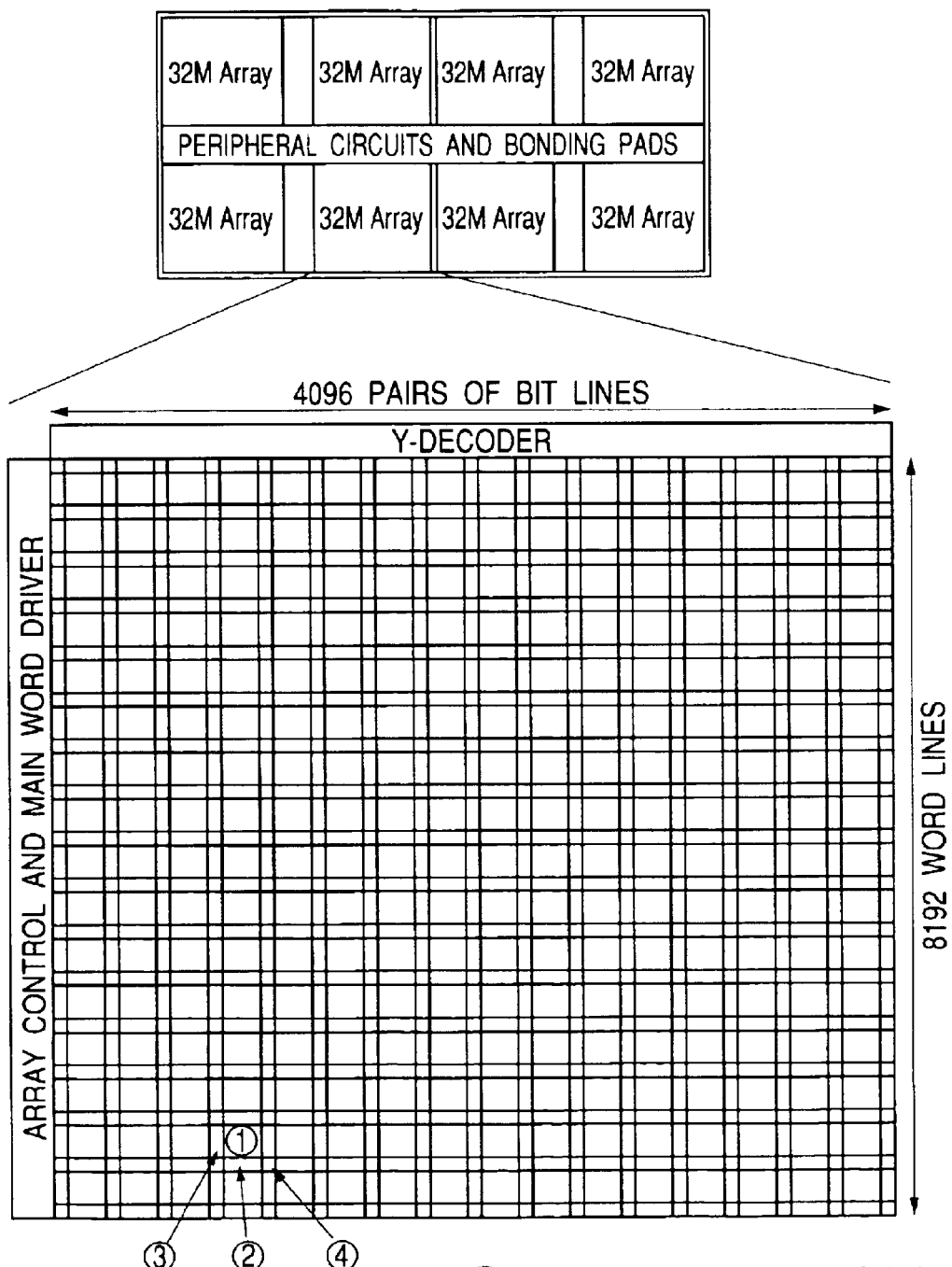
FIG. 1 is a schematic layout illustrating one example of dynamic RAM to which the present invention is applicable.

FIG. 1 is a schematic layout illustrating one example of dynamic RAM to which the present invention is applicable. Main parts of the circuit blocks constituting the dynamic RAM to which the invention is applicable are identifiably shown in FIG. 1, and are formed over a single semiconductor substrate of monocrystalline silicon, for instance, by a known semiconductor integrated circuit manufacturing technique.

The dynamic RAM in this embodiment of the invention is formed as illustrated in the schematic layout of the whole memory chip and the layout of one of the eight individual memory arrays into which the chip is divided, though the arrangement is not limited to these layouts. A memory array area is divided into four parts horizontally and two parts vertically with respect to a longitudinal direction (the direction of word lines). Each memory array (Array) is divided into eight parts, and in the middle part between them are provided a plurality of indirect peripheral circuits including address buffers, control circuits and timing control circuits, and a bonding pad array.

Each of the eight memory arrays is provided with a storage capacity of about 32 Mbits. Each memory array (Array) out of the eight memory arrays, as shown on an enlarged scale, is divided into 16 each in the direction of word lines and in the direction of bit lines to form memory cell arrays (or sub-arrays) denoted by ①. On both sides of the sub-array 1 in the direction of bit lines, sense amplifiers 2 are arranged in the direction of bit lines. On the both sides of the sub-array 1 in the direction of word lines, sub-word drivers 3 are arranged.

Each of the memory arrays is provided with a total of 8192 word lines and 4096 pairs of complementary bit lines, resulting in a total storage capacity of about 32 Mbits. Since 8192 word lines are divided into 16 sub-arrays 1, each sub-array 1 is provided with 512 word lines (sub-word lines). Also, since 4096 pairs of complementary bit lines are divided into the 16 sub-arrays 1, each sub-array 1 is provided with 256 pairs of complementary bit lines.

In the middle section between the two memory arrays mentioned above, there are provided a main row decoder, an array control circuit and a main word driver. The array control circuit contains a driver for driving first sub-word selection lines. In the memory arrays are arranged main word lines extended to penetrate the 16 sub-arrays 1 into which each array is divided. The main word driver drives the main word lines. Like the main word lines, the first sub-word selection lines are also extended to penetrate the 16 sub-array 1 into which each array is divided. Above the memory arrays are provided a Y-decoder and a Y-selection line driver (YS driver).

Each of the memory cell arrays (sub-arrays) 1, as shown in its enlarged view, is formed surrounded by sense amplifier areas 2 and sub-word driver areas 3. The intersections 4 of the sense amplifier areas 2 and the sub-word driver areas 3 are known as cross areas. Each of the sense amplifiers provided in the sense amplifier areas 2 is configured in a shared sense amplifier formula, and the sense amplifiers, except those arranged at the two ends of each memory cell array 1, have complementary bit lines provided on their right and left sides, connected selectively to either the right or left complementary bit line of the memory cell array 1.

The sub-word drivers 3 are divided into a length equal to $\frac{1}{16}$ of the main word lines, and form selection signals for the sub-word lines extending in parallel to them. In this example, eight sub-word lines are arranged in the direction of the complementary bit lines per main word line to reduce the number of main word lines, in other words to lower the wiring pitch of the main word lines, though there is no particular limitation on their number. For the selection of one out of the eight sub-word lines allocated in the direction of the complementary bit lines, a sub-word selection driver is arranged. This sub-word selection driver forms a selection signal for selecting one out of the eight sub-word selection lines extending in the direction in which the sub-word drivers are arrayed.

To focus on one of the memory cell array 1, one sub-word line is selected from every one of the 16 memory cell arrays allocated per main word line. As 4K (4096) memory cells are provided in the direction of the main word lines as stated above, 4096/16=256 memory cells are connected to each sub-word line.

As stated above, each memory array has a storage capacity of 8K (8192) bits relative to the direction of the complementary bit lines. However if memory cells equivalent to as much as 8K are connected to a single complementary bit line, the parasitic capacity of the complementary bit line will increase, making it impossible to obtain a signal level that is read out according to the capacity ratio to a capacitor for storing micro- information, and for this reason the sub-array is divided into 16 parts in the direction of the complementary bit lines as well. Thus each complementary bit line is divided into 16 parts by the sense amplifiers 2 to reduce the number of memory cells connected to each complementary bit line to a much smaller number, such as 512.

Figure 2:
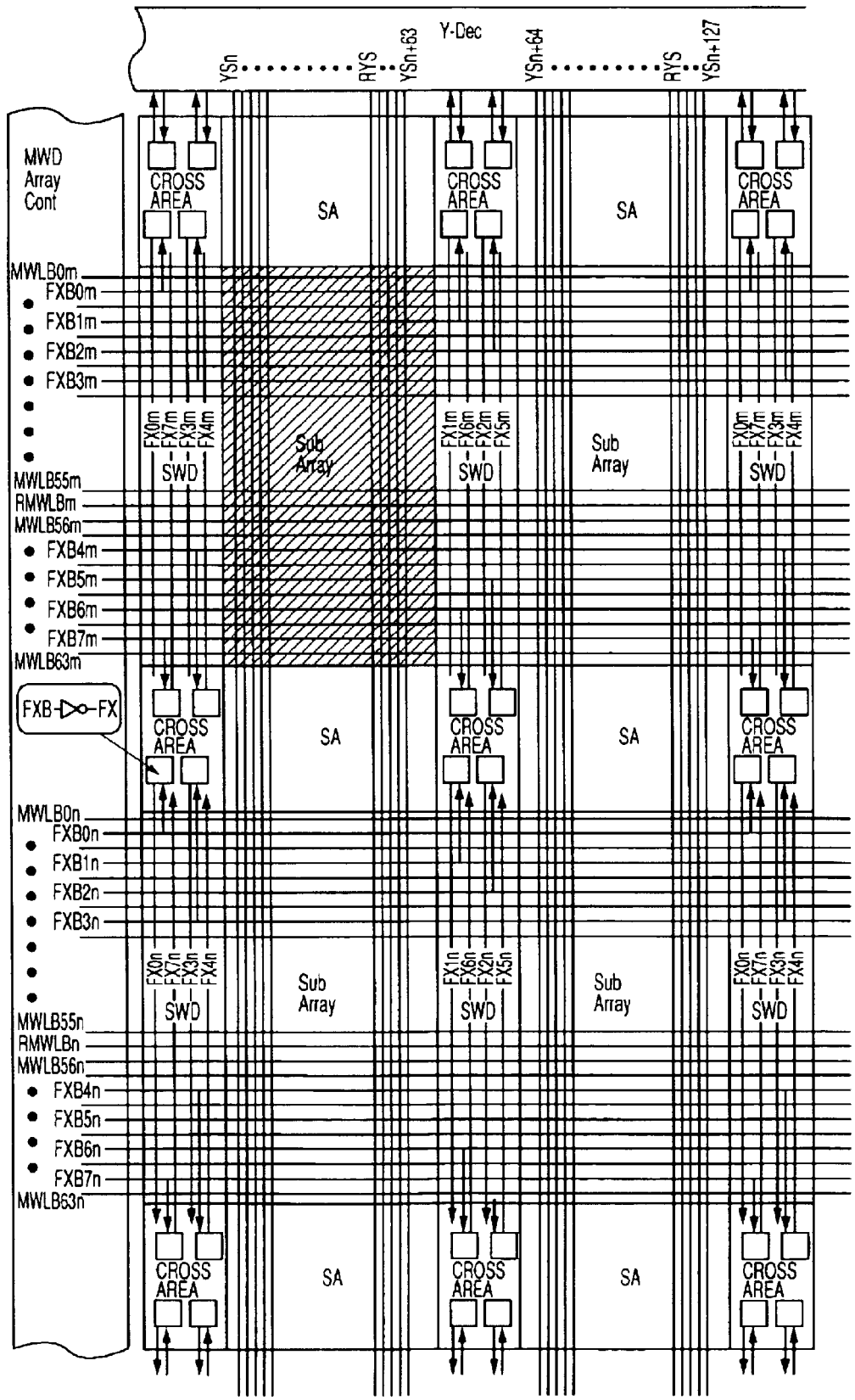
FIG. 2 is a schematic layout illustrating an example of sub-arrays and circuits peripheral thereto in the dynamic RAM pertaining to the invention.

FIG. 2 is a schematic layout illustrating an example of sub-arrays and circuits peripheral thereto in the dynamic RAM pertaining to the invention. In FIG. 2, four out of the 16×16 sub-arrays provided in the memory array shown in FIG. 1 are illustrated as representatives of all those sub-arrays. In FIG. 2, one sub-array is distinguished from the sub-word driver areas (SDW), the sense amplifier areas (SA) and the cross areas surrounding it by hatching that sub-array.

Since one main word line is allocated to each sub-array for every eight sub-word lines, a total of 512÷8=64 main word lines are provided. Accordingly, there are provided main word lines matching regular circuits consisting of main word lines MWLB0$m$ through MWLB63 and one redundant main word line RMWLBm. To enable one sub-word line to be selected out of eight sub-word lines provided for each of the 65 main word lines including the redundant main word line RMWLBm, sub-word line selection lines FXB0$m$ through FXB7$m$ are provided.

These sub-word line selection lines FXB0$m$ through FXB7$m$ are disposed to extend over the 16 sub-arrays, arranged in the direction of the word lines, from the sub-word line selection line drivers provided in array control sections matching the respective ones of the sub-arrays. For each sub-array are arranged 512 sub-word lines 256 pairs of complementary bit lines as stated above. Therefore, the 512 sub-word drivers SWD matching the aforementioned 512 sub-word lines WL are divided, and 256 each are arranged on the right and left sides of the sub-array. The 256 sense amplifiers SA provided to match the 256 pairs of complementary bit lines BL are alternately arranged in addition to the aforementioned shared sense amplifier formula, and divided into 128 each, disposed over and underneath the sub-array.

The sub-array is provided with eight reserve (redundant) word lines in addition to the aforementioned 512 regular sub-word lines WL and has 256 pairs of complementary bit lines, though the configuration is not limited to this way. Therefore, the 520 sub-word drivers SWD matching the 512+8 sub-word lines WL are divided, and 262 each are arranged on the right and left sides of the sub-array. Similarly to the above-described case, 128 sense amplifiers each are disposed over and underneath the sub-array. Thus, out of the 256 pairs of complementary bit lines formed for the sub-array, 128 pairs are commonly connected to the sense amplifiers SA between them via a shared switch MOSFET. Though not shown in this drawing, the sub-array is also provided with a plurality of pairs of redundant bit lines matching the units of bit line selection.

The 65 main word lines MWL, as three (MWLB0$m$, MWLB55$m$, MWLB56$m$ and MWLB63$m$) are shown representing them, are extended in the horizontal direction as described above. On the other hand, column selection lines YS, of which YSn through RYS and YSn+63 are shown as representatives, are extended in the vertical direction. The sub-word lines WL (not shown) are arranged in parallel to the main word lines MWL, and the complementary bit lines BL(not shown) are arranged in parallel to the column selection lines YS.

Eight sub-word selection lines FXB0m through FXB7m penetrate the 16 sub-arrays arranged in the direction of the word lines as do the main word lines MWL. They are divided into four each, the sub-word selection lines FXB0m through FXB3m and the FXB4m through FXB7m, and extended over the sub-arrays.

Over the sub-arrays, one main word line is provided for every eight sub-word lines, and a sub-word selection line is required for selecting one out of the eight sub-word lines. Since one main word line MWL is formed for every eight sub-word lines WL which are formed to match the pitch of memory cells, the wiring pitch of the main word lines MWL is low. There the sub-word selection lines can be readily formed between main word lines by utilizing the same wiring layer as that of the main word lines MWL.

Figure 3:
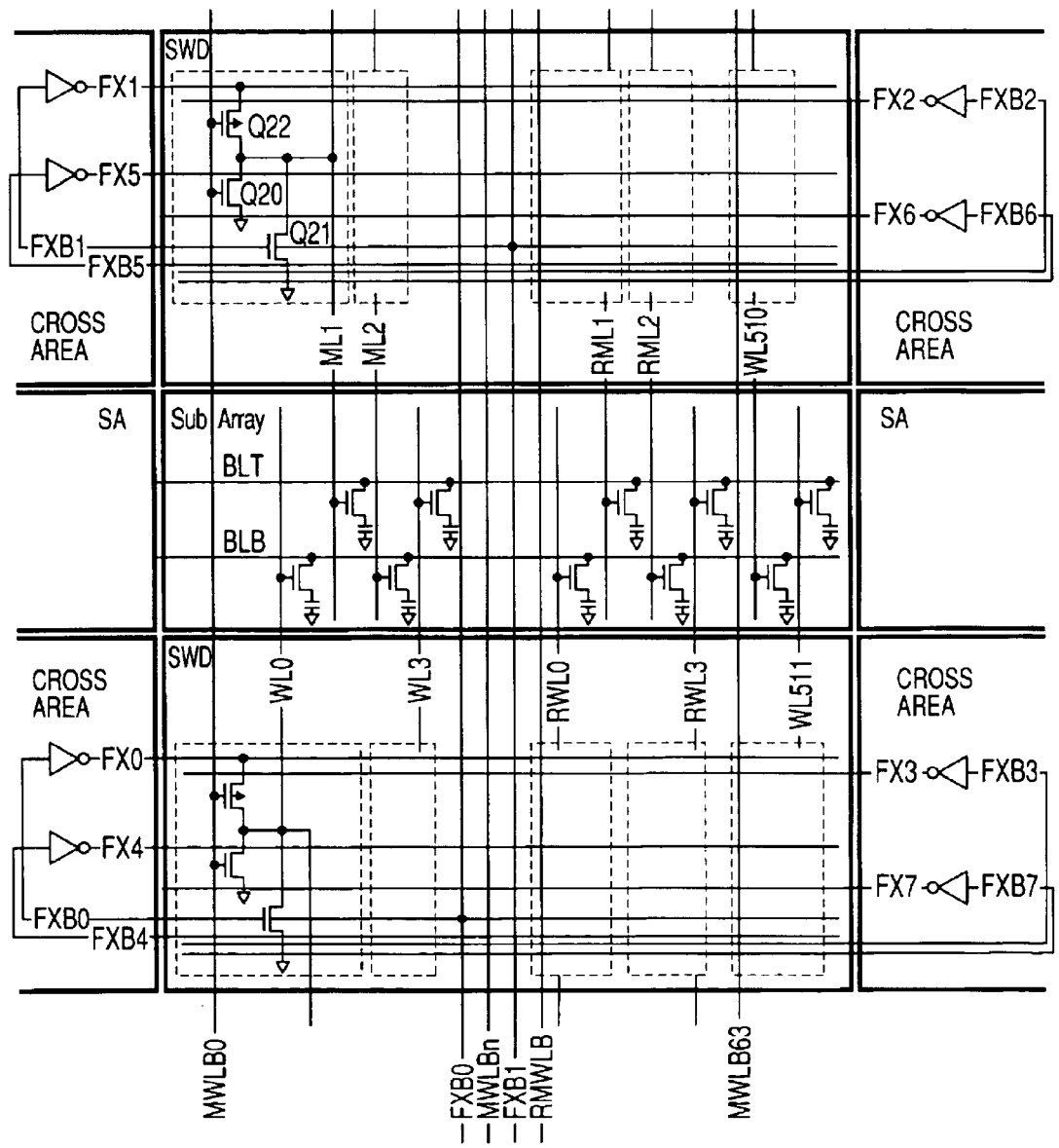
FIG. 3 is a circuit diagram of an example focusing on sub-arrays and sub-word drivers in the dynamic RAM pertaining to the invention.

Each of the sub-word drivers SWD in this embodiment, as typically shown in FIG. 3, consists of an N-channel type MOSFETs Q20 and Q21 and a P-channel type MOSFET Q22. The MOSFETs Q20 and Q22 constitute a CMOS inverter circuit, whose input terminals, i.e. the gates of the MOSFETs Q20 and Q22, are connected to the main word line MWL80. To the gate of the MOSFET Q21 provided between the sub-word line WL1 and the ground potential of the circuit is connected the sub-word selection line FXB1, and a selection signal FX1 resulting from its inversion by an inverter circuit is given to the source of the MOSFET Q22 as the operating voltage.

Each of the sub-word drivers SWD is so configured as to be able to simultaneously select the sub-word lines WL1 of the sub-arrays arranged to its right and left. The two sub-word drivers sandwiching a sub-array alternately select every third one of the 512 sub-word lines (redundant word lines RWL0 through RWL7). However, the sub-word lines WL0 and WL511 at the both ends are one each, shared to right and left.

Referring to FIG. 2, inverter circuits for forming the selection signal FX1 by inverting the signal of the sub-word selection line FXB1 are provided in cross areas. A total of eight inverter circuits consisting of two each in the cross areas at the four corners of the sub-array are provided, and the FX signals (operating voltages) are supplied to the sub-word drivers via these inverter circuits. As stated above, 512 sub-word drivers and eight redundant drivers are provided for each sub-array, and they are divided into eight sets. Therefore, one inverter circuit is responsible for 65 sub-word drivers including a redundant circuit, and such selection signal lines FX0m through FX7m are divided into two sets, and arranged so as to extend over the sub-word drivers SWD in the direction of the bit lines.

In FIG. 2, since the sub-array and the circuits peripheral thereto are configured by repeating the same pattern, four inverter circuits are shown to be provided in the cross areas at the upper end of the memory array, but two of them are dummies and dispensable. The sense amplifiers SA arrayed in these cross areas are shared sense amplifiers as mentioned above, and they perform amplification for the bit lines provided below them because there is no sub-array above them. Similarly, the sub-word drivers at the end of the memory array drive only the sub-word lines WL to the left because there is no sub-array to the right.

In a configuration in which sub-word selection lines FXB are arranged in the gaps of the pitch of the main word lines MWL over the sub-arrays as in this embodiment of the invention, there is no need for any dedicated wiring channel, and therefore the arrangement eight sub-word selection lines per sub-array invites no increase in the memory chip size. It is also possible, as will be described afterwards, to arrange the power supply lines for supplying required voltages for the operations of the sub-word drivers and the sense amplifiers in such gaps of the pitch of the main word lines MWL.

As shown in FIG. 3, a dynamic type memory cell, provided between sub-word lines WL provided over the one sub-array mentioned above and one bit line BL out of the complementary bit lines BLT and BLB, is configured of an address selecting MOSFET and a storage capacitor. The gate of the address selecting MOSFET is connected to the sub-word lines WL; the drain of this MOSFET is connected to the bit lines BLT; and to its source is connected the storage capacitor. The other electrode of the storage capacitor Cs is communized, and fed with a plate voltage VPLT. Though this is no particular limitation, a negative back bias voltage VBB is applied to the substrate (channel) of the address selecting MOSFET. The selection level of the sub-word lines WL is a high voltage VPP, higher than the high level of the bit line BLT or BLB by the threshold voltage of the address selecting MOSFET.

When the sense amplifier is disposed to operate on an internal reduced voltage VDL, the high level amplified by the sense amplifier and given to the bit lines is at the level of the internal voltage VDL. Therefore, the high voltage VPP matching the selection level of the word lines is VDL+Vth+α. The one pair of complementary bit lines BLT and BLB of the sub-array provided to the left of the sense amplifier are arranged in parallel as shown in FIG. 3, and crossed as appropriate to balance the capacities of the bit lines or for other purposes.

Figure 4:
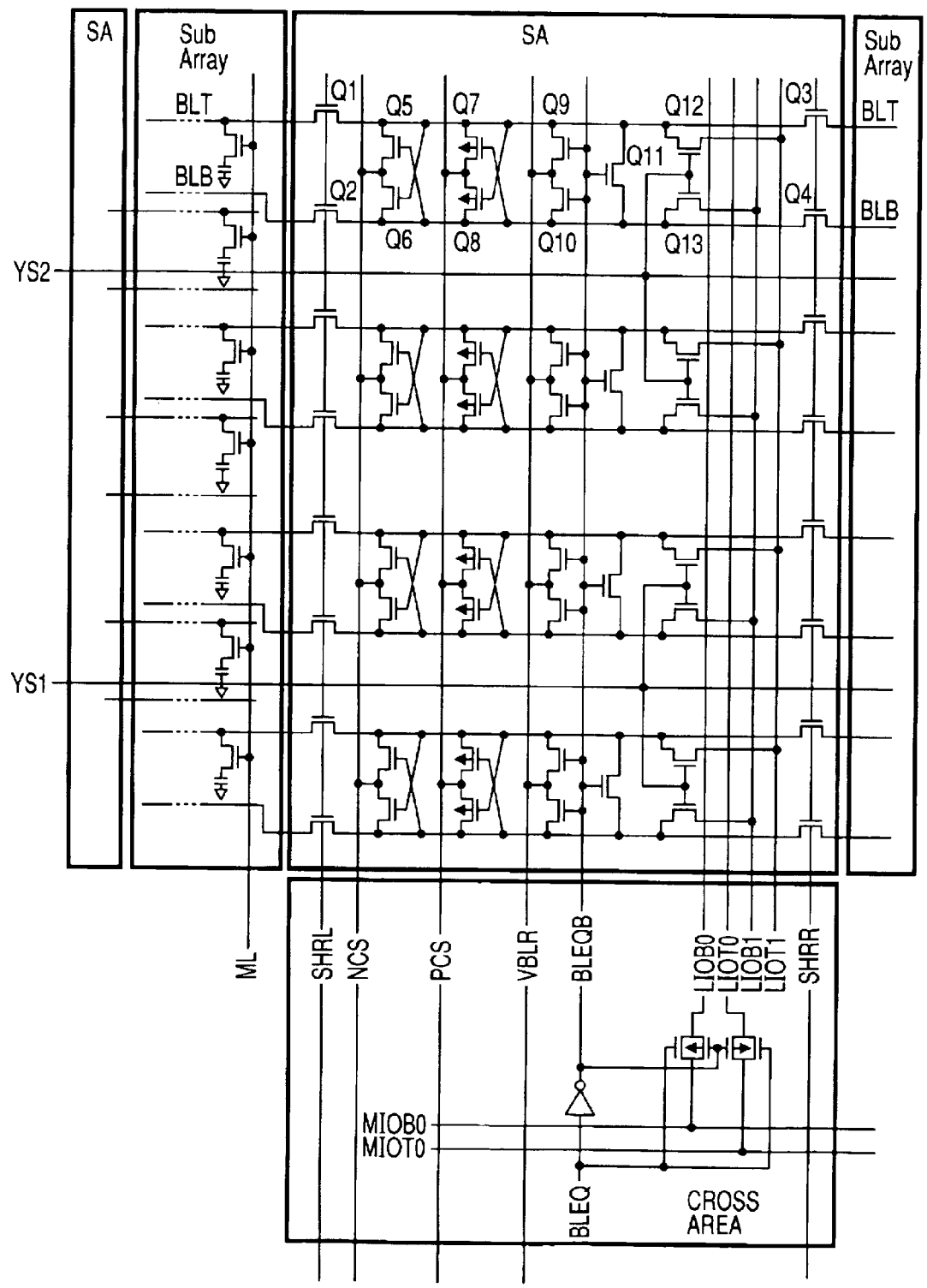
FIG. 4 is a circuit diagram of an example focusing on sub-arrays and sense amplifiers in the dynamic RAM pertaining to the invention.

As shown in FIG. 4, the constituent units of the sense amplifier comprise N-channel type amplifying MOSFETs Q5 and Q6, and P-channel type amplifying MOSFETs Q7 and Q8 in a latched state resulting from cross connection of gates and drains. The sources of the N-channel type MOSFETs Q5 and Q6 are connected to a common source line NCS, while the sources of the P-channel type MOSFETs Q7 and Q8 are connected to a common source line PCS. Though not shown, to each of the common source lines NCS and PCS is connected a power switch MOSFET. The common source line NCS to which the sources of the N-channel type amplifying MOSFETs Q5 and Q6 are connected is provided with an operating voltage VSS, matching the ground potential, by an N-channel type power switch MOSFET(not shown) disposed in one of the cross areas mentioned above, though this is no particular limitation.

Though not shown, the common source line PCS to which the sources of the P-channel type amplifying MOSFETs Q7 and Q8 are connected is provided, though they are no particular limitations, with an N-channel type power MOSFET for overdrive use and an N-channel type power MOSFET for supplying the aforementioned internal voltage VDL, disposed in one of the cross areas. As the voltage for overdrive use, a source voltage VDD supplied from an external terminal is used, for instance. Alternatively, in order to reduce the dependence of the operating speed of the sense amplifier on the source voltage VDD, the arrangement may as well be such that that a raised voltage VPP be applied to the gate, the drain be connected to the source voltage VDD and the source receive the aforementioned voltage, slightly reduced from the source voltage VDD.

A first activating signal supplied to the gate of the MOSFET for overdrive use is made a signal of the same phase as a second activating signal supplied to the gate of the N-channel type MOSFET for supplying the operating voltage VDL, and the first and second activating signals are raised to a high level in a time series. The high level of the first and second activating signals are supposed to be the level of the raised voltage VPP, though this is no particular limitation. This enables the aforementioned voltage for overdrive use and VDL to be supplied even with an allowance for the voltage loss equivalent to the threshold voltage in the N-channel type MOSFET.

The pair of input/output nodes of the constituent units of the sense amplifier are provided with a precharge circuit (or an equalize circuit) consisting of an equalize MOSFET Q11 for short-circuiting complementary bit lines and switch MOSFETs Q9 and Q10 for supplying a half precharge voltage VBLR to the complementary bit lines. The gates of these MOSFETs Q9 through Q11 are commonly supplied with a precharge (equalize) signal BLEQB. A driver circuit for generating this precharge signal BLEQB, though not shown, is provided with inverter circuits in the cross areas and accelerates its fall. Thus, ahead of the timing of word line selection at the start of memory access, it switches the MOSFETs Q9 through Q11 constituting the precharger circuit to high speed through inverter circuits provided distributively in the cross areas.

The constituent units of the sense amplifier are connected to the complementary bit lines BLT and BLB of the sub-array on the left side of the drawing via the shared switch MOSFETs Q1 and Q2 and to the similar complementary bit lines BLT and BLB of the sub-array on the right side of the drawing via the shared switch MOSFETs Q3 and Q4. Switch MOSFETs Q12 and Q13, which constitute a column switch circuit, are turned on when the selection signal YS2 is set to the selection level (the high level), bring one pair of input/output nodes, which are constituent units of the sense amplifier, into connection to local input/output lines LIOT1 and LIOB1. The sense amplifier section is provided with similar local input/output lines LIOT0 and LIOB0. They are connected to the input/output nodes of the adjoining sense amplifier via a MOSFET under similar switching control by the selection signal YS2. This enables a single selection line to have a single sense amplifier array read out two bits.

The aforementioned shared switch circuit, if for instance the sub-word line WL of the sub-array on the left side is selected, keeps in an ON state the shared switch MOSFETs Q1 and Q2 on the left side of the sense amplifier and turns off the shared switch MOSFETs Q3 and Q4 on the right side. Conversely, if the sub-word line WL of the sub-array on the right side is selected, the shared switch MOSFETs Q1 and Q2 on the right side of the sense amplifier is kept on and the shared switch MOSFETs Q3 and Q4 on the left side is turned off. This causes the sense amplifier to amplify signals on the complementary bit lines BLT and BLB of the sub-array on the selected side.

The input/output nodes of the sense amplifier work in such a manner that, if for instance the sub-word line of the left side sub-array is selected, the connection to the left side complementary bit lines BL and BLB is maintained, and the micro-signals of memory cells connected to the selected sub-word line WL are amplified and conveyed to local input/output lines LIOT1 and LIOB1 via the column switch circuits (Q12 and Q13). The local input/output lines LIOT0 and LIOB0 (LIOT1 and LIOB1) are connected to main input/output lines MIOT0 and MIOB0 connected to a main amplifier and a light amplifier, neither shown via a CMOS switch circuit consisting of an N-channel type MOSFET and a P-channel type MOSFET and provided in a cross area.

Though not shown in this drawing, a similar switch circuit and main input/output lines MIOT1 and MIOB1 are provided to match local input/output lines LIOT1 and LIOB1.

The column switch circuit connects with one selection signal YS two pairs of complementary bit lines BLT and BLB to two pairs of local input/output lines LIOT0–LIOB0 and LIOT1–LIOB1, though this is no particular limitation. Therefore, selection with a single signal YS enables four bits to be simultaneously read/written because the two pairs of column switch circuits matched with one pair of sense amplifiers provided on the two sides of a sub-array selected by a main word line selecting action results in the selection of a total of four pairs of complementary bit lines.

As in the embodiment shown in FIG. 1, 17 arrays of sense amplifiers are provided for every 16 sub-arrays. Since only one pair of local input/output lines is provided for a sense amplifier on each edge side, the memory array can read/write a maximum of 16×4=64 bits. However, a selector circuit with an IO line reads, for instance, a half of the bits, i.e. 32 bits, which are amplified by the main amplifier, 16 of them being supplied at a time in synchronism with the leading and trailing edges of a clock in a DDR SDRAM to be described afterwards.

Figure 5:
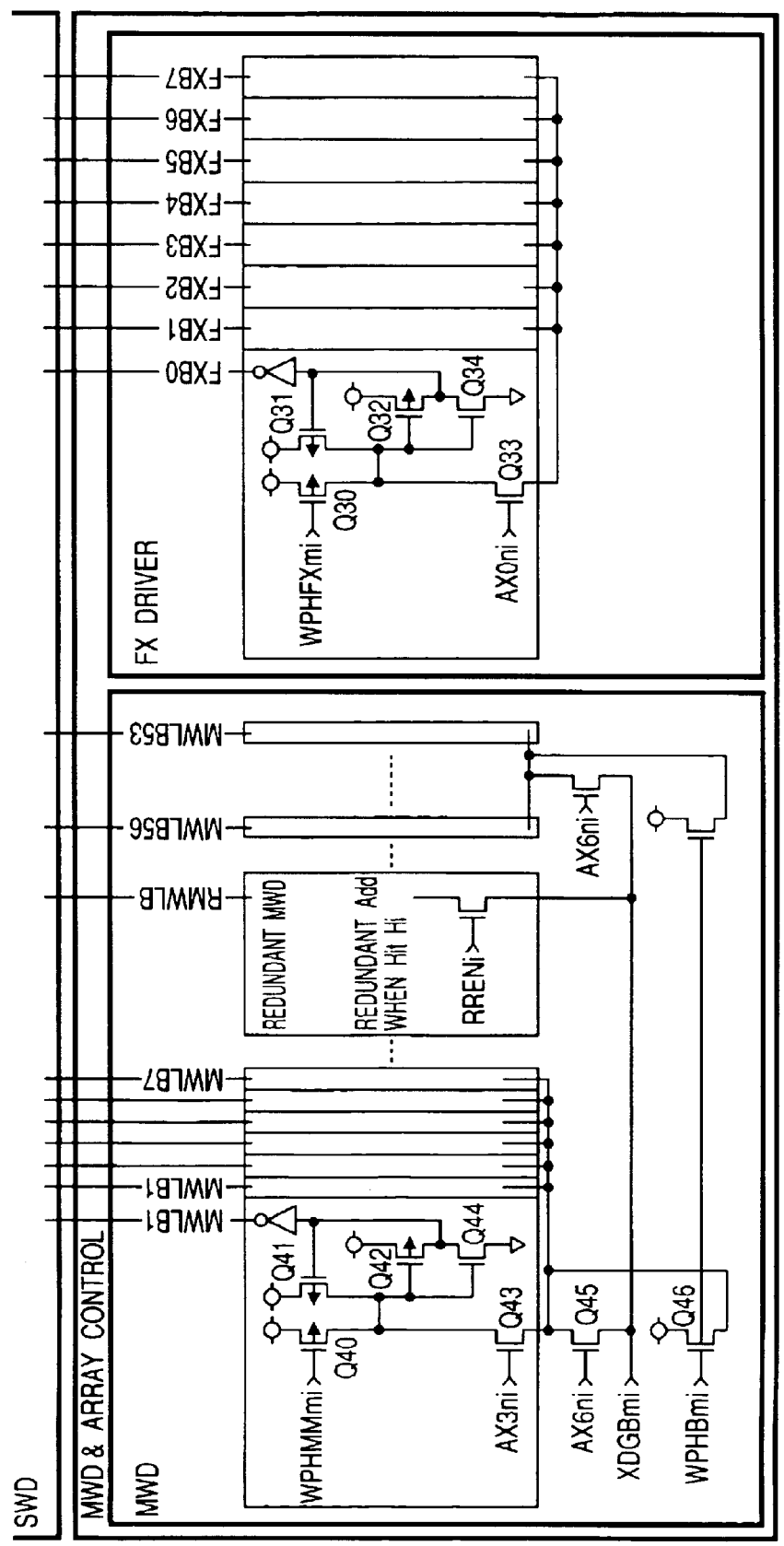
FIG. 5 is a circuit diagram of an example focusing on a main word driver and an FX driver in the dynamic RAM pertaining to the invention.

As shown in FIG. 5, a main word driver MWD provided to match the memory array has 64 main word lines MWL each matching one or another of the sub-arrays into which the memory array is divided by 16 in the direction of the bit lines, a total of 65 decoders and drivers for selecting a single redundant main word line RMWL, and eight drivers matching sub-word selection lines FX for selecting one of eight sub-word lines allocated per main word line. In FIG. 5, one each of main word driver MWD and FX driver matching one of the sub-array are shown by way of example.

A driver for sub-word selection lines FX consists of a level converter circuit which, comprising MOSFETs Q30 through Q34 or the like for instance, receives a corresponding signal AX0$ni$ of an internal circuit formed by deciphering address signals A0 through A2 of the three least significant bits of an X-address signal, for example, and converts it into a raised voltage VPP level, and an inverter circuit or the like for driving with this voltage the sub-word selection lines FXB0 and so forth. Out of the sub-word selection lines FXB0 through FXB7, what are selected take on a low level, such as the ground potential of the circuit, and what are not take on the raised voltage VPP level.

The main word driver MWD is constituted of a level converter circuit which, comprising MOSFET Q40 through Q46 or the like, receives X-predecode signals AX3$ni$ and AX6$ni$ and the like, for example, and converts it into a raised voltage VPP level, and an inverter circuit or the like for driving with this voltage the main word lines MWL and so forth. Out of the main word line selection signals MWLB0 through MWLB63, what are selected take on a low level, such as the ground potential of the circuit, and what are not take on the raised voltage VPP level. A redundant main word driver, with a redundant address bit signal RREN$i$, reduces a redundant main word line selection signal RMWLB to a low level, such as the ground potential, at the time of hit. The selection signal RMWLB remains at the raised voltage VPP level if there is no hit.

Figure 6:
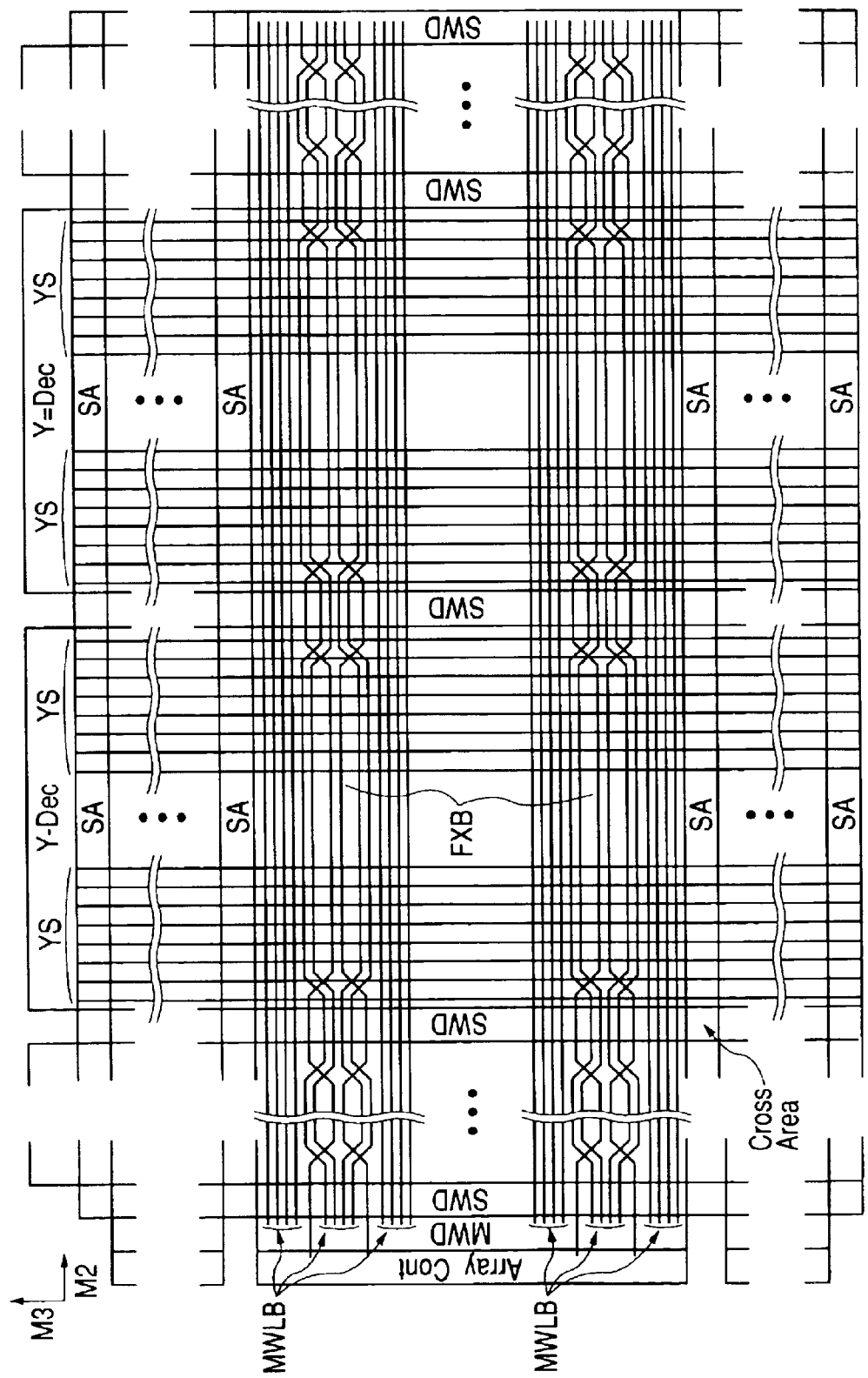
FIG. 6 shows the arrangement of upper layer wiring in one example of memory array section in the dynamic RAM pertaining to the invention.

FIG. 6 shows the arrangement of upper layer wiring in one example of memory array section in the dynamic RAM pertaining to the invention. As described above, the wiring uses an 8FX hierarchical word line system for the selection of word lines, and has 64 main word lines MWL and 8FX lines in the direction of the word lines for the sub-arrays.

These wiring lines are configured of, for instance, the second layer, which is a metal layer M2, and are governed by the strict rules on the sub-word driver SWD layout by the highly dense arrangement of circuit elements.

During the study process preceding the invention under the present application, a technique was conceived by which another signal of power supply line would be run for a few main word lines. Such a layout technique would enable main word lines and other lines to be arranged in a similar repetitive pattern. However, it was noticed that when the increase in density narrowed the spacing of wiring, short circuiting faults between lines would become too serious to ignore. For instance, although short circuiting between main word lines MWL as mentioned above could be relieved by switching to redundant main word lines, short circuiting between a main word line MWL and a sub-word selection line FX or between a main word line MWL and a power supply line would become a D.C. fault or a function fault, which cannot be relieved.

Where an irrelievable power supply line or signal line (FX) is arranged in addition to main word lines MWL in a sub-array, the probability of the occurrence of a fault in which adjoining lines are short-circuited by an extraneous object dropping on them can be represented by the following Equation (1).

Probability of fault occurrence=(Power supply line+signal line)×2/ (MWL+power supply line+signal line)×2+1   (1)

From Equation (1) above, it is seen that the probability of fault occurrence can be lowered by reducing the numbers of power supply lines and signal lines on the memory cell array (sub-array), it is difficult to reduce the numbers of power supply lines and signal lines provided on the memory cell array by altering the circuitry or characteristics or reducing the chip size. Viewed the other way around, in a semiconductor memory device in which one main word line is allocated for every eight sub-word lines, it is indispensable for chip size compression to effectively utilize the wiring layer in which main word lines are arranged at a low pitch.

In the example shown in FIG. 6, the probability of fault occurrence is reduced by separately arranged relievable wiring and irrelievable wiring. Thus, irrelievable sub-word selection lines and power supply lines are arranged consecutively adjacent wherever practicable to minimize the number of such irrelievable lines adjoining relievable main word lines MWL.

For this reason, in this embodiment of the invention, a cross-over channel for the second metal wiring layer M2, constituting main word lines MWL is secured on the memory cell array whose wiring pitch is relatively low, and other wiring lines, such as FXB, than the main word lines MWL are arranged on the memory cell array to be consecutive.

In FIG. 6, although the illustrative expression is such that sub-word selection lines FXB look as if they crossed each other on the border between the memory cell array section and the sub-word drivers SWD, the main word lines MWL and the sub-word selection lines FXB cross each by using a third metal layer M3 provided over them as will be described below, and in the memory cell array section the sub-word selection lines FXB are arranged consecutively.

Figure 7:
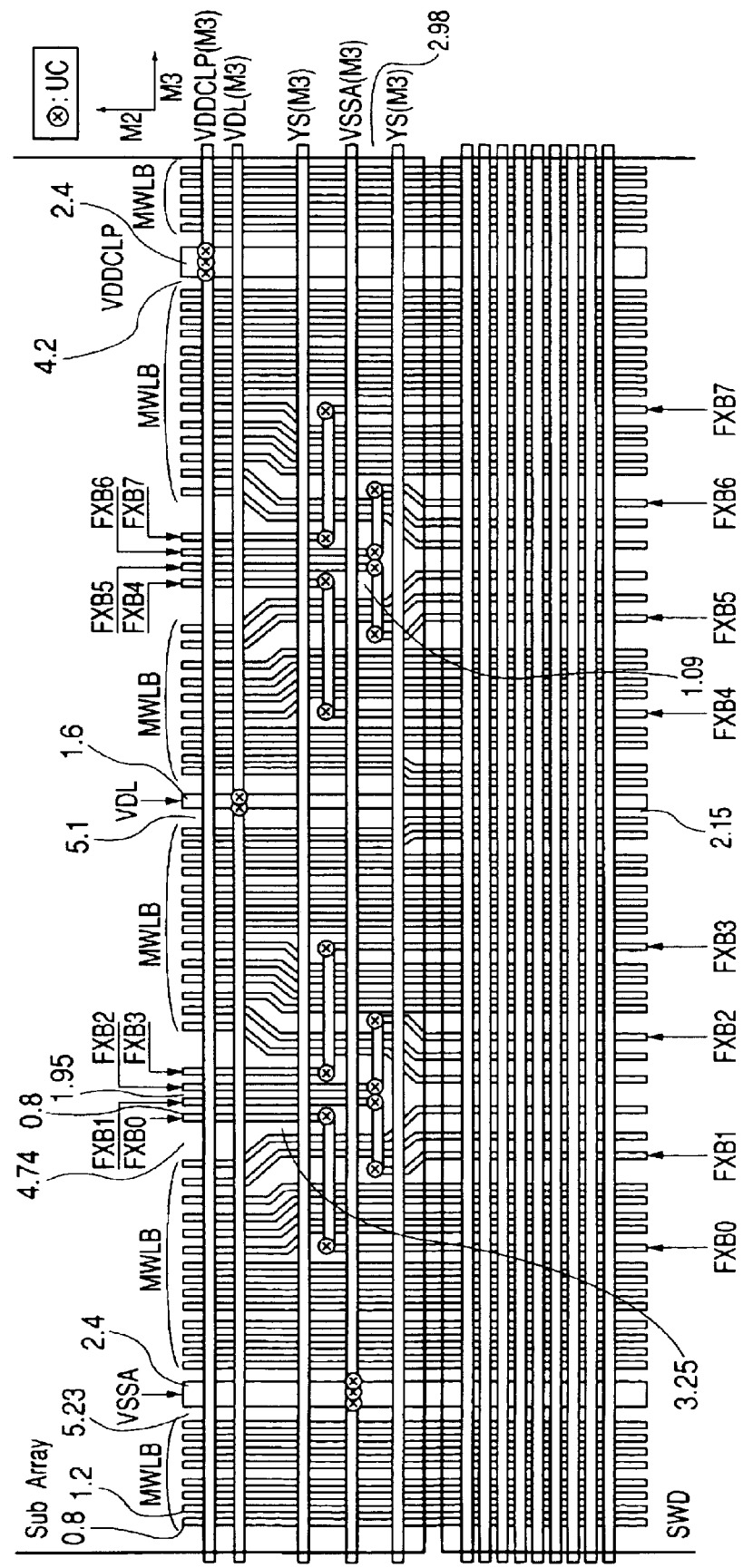
FIG. 7 is a schematic layout of upper wiring lines M2 and M3 showing one example of memory array section in the dynamic RAM pertaining to the invention.

FIG. 7 is a schematic layout of upper wiring lines M2 and M3 showing one example of memory array section in the dynamic RAM pertaining to the invention. Referring to FIG. 7, the second metal layer M2 is extended in the extending direction of the word lines (the horizontal direction), and the third metal layer M3 is extended in the vertical direction. In the memory cell array section, the main word lines MWLB, the sub-word selection lines FXB0 through FXB7 and the power supply lines VSSA, VDL and VDDCLP constitute the second metal layer M2, while the column selection lines YS and the power supply lines VDL, VSSA and VDDCLP constitute the third metal layer M3 in the memory cell array section.

The power supply lines VDL, VSSA and VDDCLP, by their mutual connection at the intersections of the second metal layer M2 and the third metal layer M3, are meshed over the memory cell array, and extended by the third metal layer M3 to the sense amplifier section to provide the operating voltages VDL and VSSA and the voltage VDDCLP for overdrive use.

The eight sub-word selection lines FXB0 through FXB7 are divided into two sets of four sub-word selection lines FXB each over the sub-word driver area and one sub-word selection lines FXB is arranged after every four main word lines MWL to match the arrangement at four-unit intervals of the 32 (×2) sub-word drivers formed in the two sub-word drivers SWD area with the memory cell array held between them to facilitate connection to those sub-word drivers.

In the memory cell array section, in order to reduce the rate of fault occurrence, the sub-word selection lines are put together into two sets of four each, such as FXB0 through FXB3 and FXB4 through FXB7, and in each set the sub-word selection lines adjoin each other. To rearrange the sub-word lines FXB and the main word lines MWL in such a way, cross-wiring is done by utilizing the third metal layer M3 in the sub-array adjoining the sub-word driver area SWD.

In the sub-word driver area SWD, the wiring comprised of the third metal layer M3 constitutes, as shown in FIG. 3 and elsewhere, signal lines for conveying selection signals from the sub-word selection lines FXB to the gate of the resetting MOSFET Q21 and the inverter circuit for inverting those signals, signal lines for conveying signals from the inverter circuit to the source of the MOSFET Q22 constituting the sub-word drivers, and the grounding line of the circuit.

Some examples of the thickness and spacing of the wiring lines in the memory array section are given below: the wiring thickness of the main word lines MWLB and of the sub-word selection lines FXB is 0.8 μm (the unit μm is omitted hereinafter); that of the power supply lines VSSA and VDDCLP, 2.4; that of the power supply line VDL, 1.6; the spacing between one main word line MWLB and the next, 1.2; that between one sub-word selection line FXB and the next, 1.95; that between one main word line MWLB and the next sub-word selection line FXB, 4.74; that between one main word line MWLB and the next power supply line VSSA, 5.23; that between one main word line MWLB and the next power supply line VDL, 5.1; and that between one main word line MWLB and the next power supply line VDDCLP, 4.2.

The spacing of wiring in the sub-word driver SWD is as follows: the narrowest spacing between one main word line MWLB and the next sub-word selection line FXB is 3.25, and that between one main word line MWLB and the next power supply line VDL, 2.15. To explain characteristic points in this regard, in the memory array section, the spacing between one sub-word selection line FXB and the next is greater than that between one main word line MWLB and the next, and the spacing between main word line MWLB and the next sub-word selection line FXB is greater than that between one sub-word selection line FXB and the next. By setting the spacing of wiring in this way, it is made possible to reduce the probability for the sub-word selection lines FXB, which are more difficult to relieve than the main word lines MWLB, to be made faulty by the sticking of foreign matter or the like to the sub-word selection lines FXB in their manufacturing process.

Figure 8:
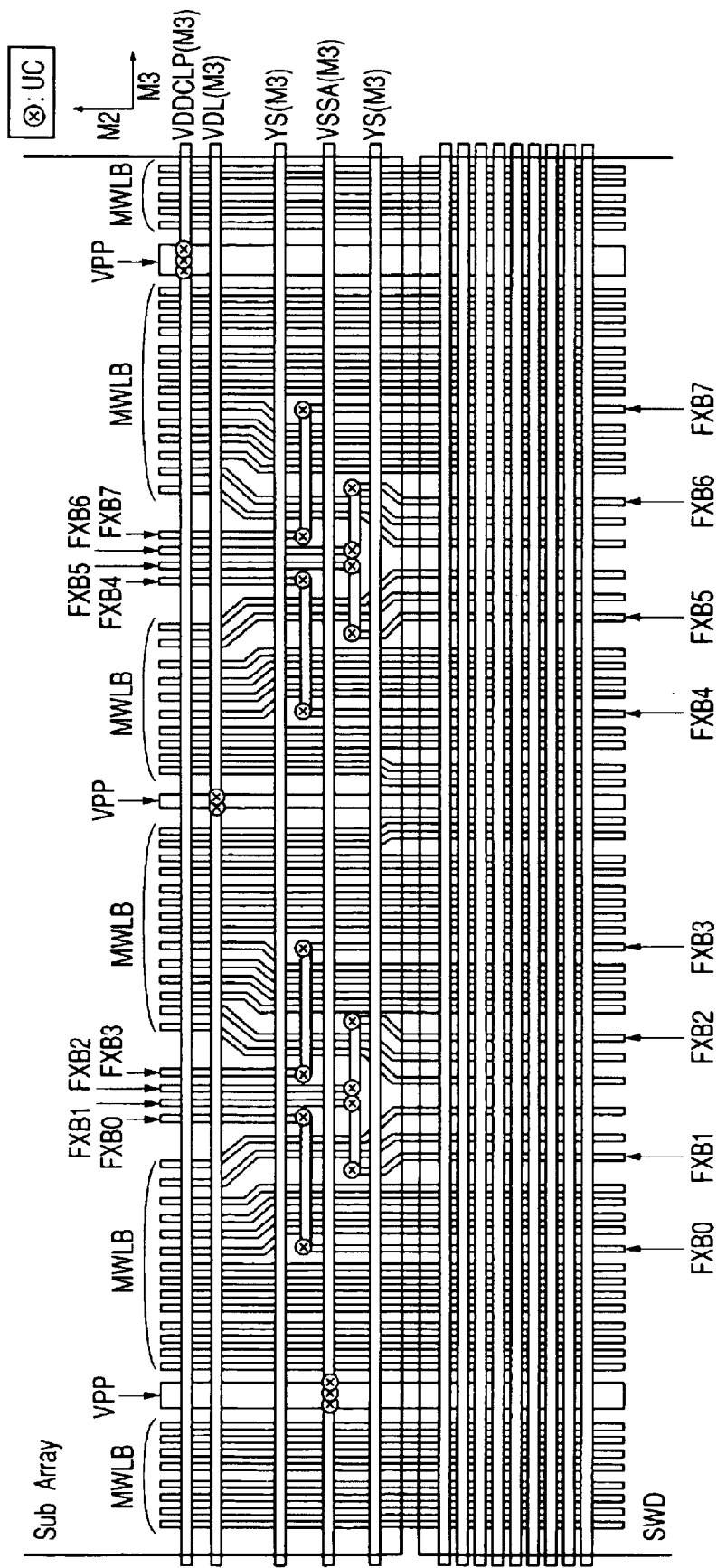
FIG. 8 is a schematic layout of upper wiring lines M2 and M3 showing another example of memory array section in the dynamic RAM pertaining to the invention.

FIG. 8 is a schematic layout of upper wiring lines M2 and M3 showing another example of memory array section in the dynamic RAM pertaining to the invention. Referring to FIG. 8, in place of the power supply lines VSSA, VDL and VDDCLP shown in FIG. 7, raised voltages VPP are provided. These power supply lines VPP are meshed over the memory cell array by being mutually connected at the intersections between the second metal layer M2 and the third metal layer M3, and enabled by M2 or M3 to provide operating voltages to the inverter circuit for generating inverted signals and the circuit for generating sense amplifier activating signals, provided in cross areas.

In a configuration such as that of this example in which VPP power supply lines are arranged over the memory cell array, even if any short circuiting fault arises in a main word line MWL adjoining a power supply line VPP, relief is possible by replacing the main word line MWL having run into the short circuiting fault with a redundant word line RMWL. Thus, the main word line MWL having run into the short circuiting fault, even if the non-selection level is the VPP level and the memory is to be accessed, can maintain VPP, which is the selection level, by replacement with the redundant main word lines RFMWL. Therefore, because any short circuiting with a power supply line VPP supplying the raised voltage VPP does not actually constitute a fault, the effective probability of fault occurrence can be reduced.

Figure 9:
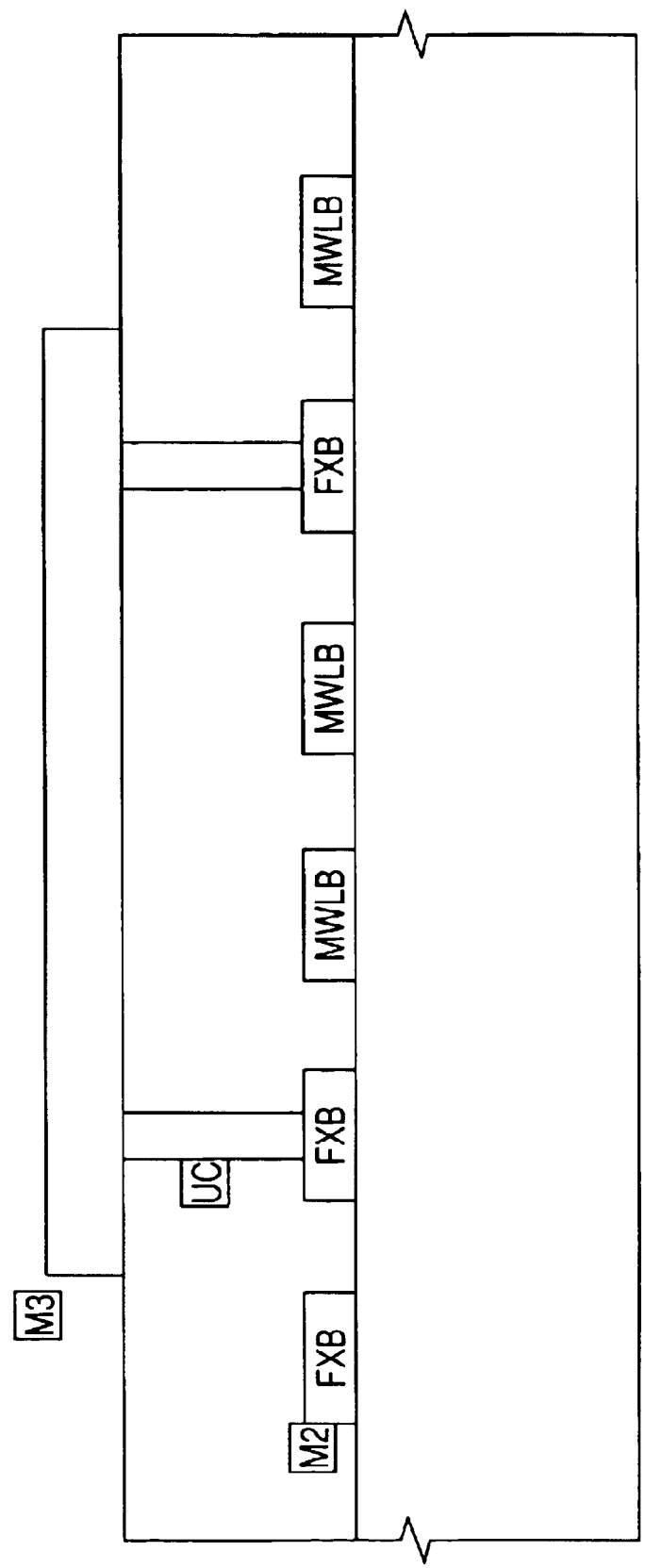
FIG. 9 is a schematic sectional view of wiring in one example of memory array section in the dynamic RAM pertaining to the invention.

FIG. 9 is a schematic sectional view of wiring in one example of memory array section in the dynamic RAM pertaining to the invention. This example refers to the cross wiring part of the second metal layer M2 utilizing the third metal layer M3 in the sub-array section adjoining the sub-word driver area SWD. By utilizing the third metal layer M3 as in this example, sub-word selection lines FXB can be caused to adjoin each other by having two second metal layers M2 constituting the main word lines MWLB cross each other.

FIGS. 10 show a wiring arrangement for describing the invention. The wiring lines hatched in FIG. 10(A) are irrelievable line such as the aforementioned sub-word selection lines FXB and power supply lines, and if they are distributed between relievable lines such as main word lines MWLB, a short circuiting fault occurring in any of the eight positions ① through ⑧ will become a real fault even though the main word lines MWL are relievable.

On the other hand, the aforementioned four irrelievable lines are consecutively arranged adjoining one another as shown in FIG. 10(B), a short circuiting fault occurring in any of the five positions ① through ⑤ will become a real fault even though main word lines MWLB are relievable. Thus, as the number of potential locations of irrelievable faults is reduced by three, the probability of fault occurrence can be increased by merely altering the wiring arrangement. Therefore, where there are eight irrelievable sub-word selection lines FXB in the foregoing example, though it is desirable to arrange the eight lines together, in practice the arrangement of the sub-word drivers, the main word driver, the sub-word selection line drivers and so forth imposes limitation, and accordingly the eight lines are divided into two pairs of four each and arranged together over the memory cell array in the foregoing example.

Figure 11:
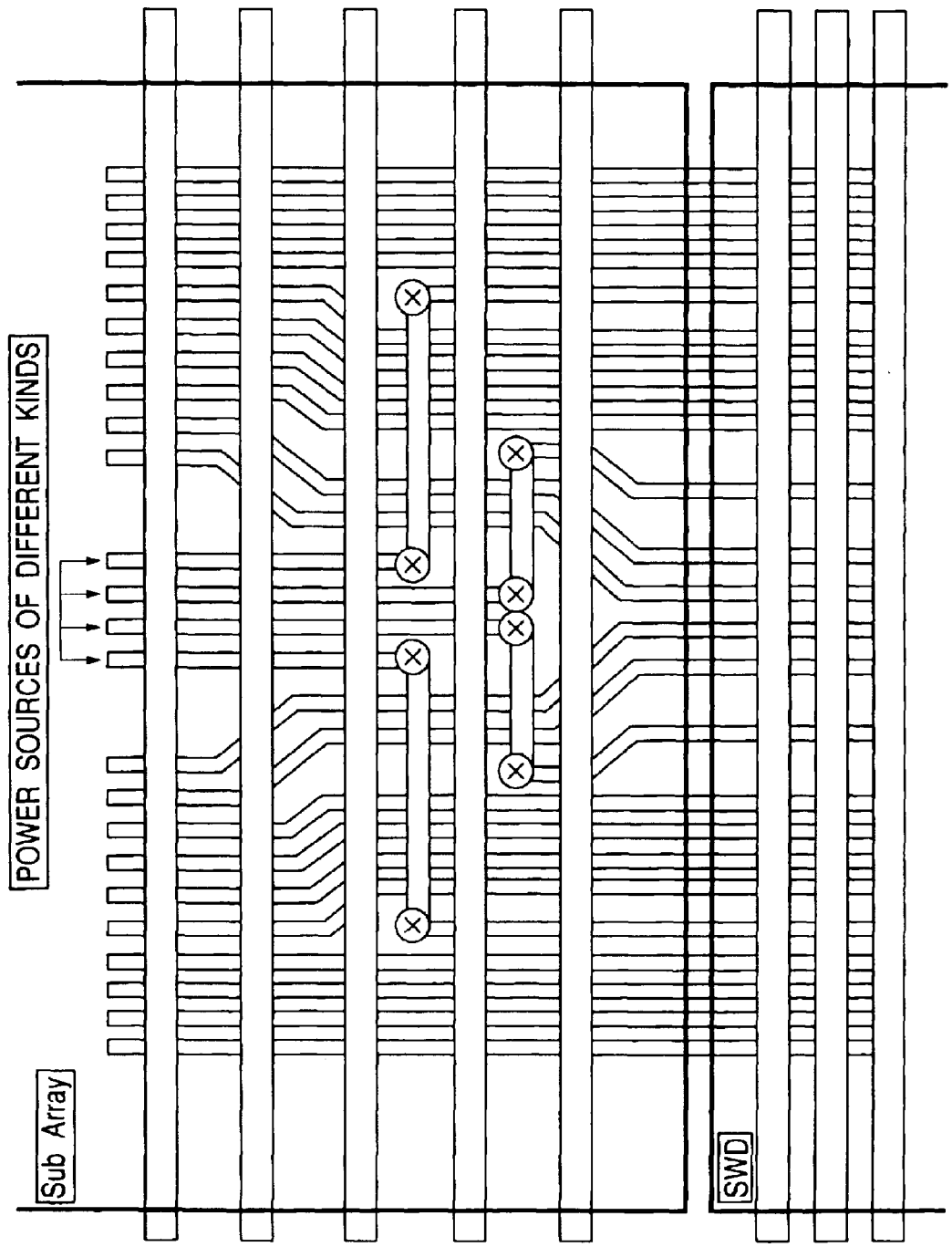
FIG. 11 is a schematic layout of upper wiring lines M2 and M3 showing another example of memory array section in the dynamic RAM pertaining to the invention.

FIG. 11 is a schematic layout of upper wiring lines M2 and M3 showing another example of memory array section in the dynamic RAM pertaining to the invention. Referring to FIG. 11, where there are a plurality of power supply lines of different kinds, such as VSSA, VDL and VDDCLP, as in the example shown in FIG. 7, the probability of fault occurrence can be lowered by arranging them adjacent to one another like the aforementioned sub-word selection lines FXB. Though this is no particular limitation, this example is devised to reduce the probability of short circuiting fault occurrence between the main word lines and the power supply lines by using a broader spacing between the power supply lines and the adjacent main word lines at the two ends than the spacing of the arrangement of the different kinds of power supply lines.

Figure 12:
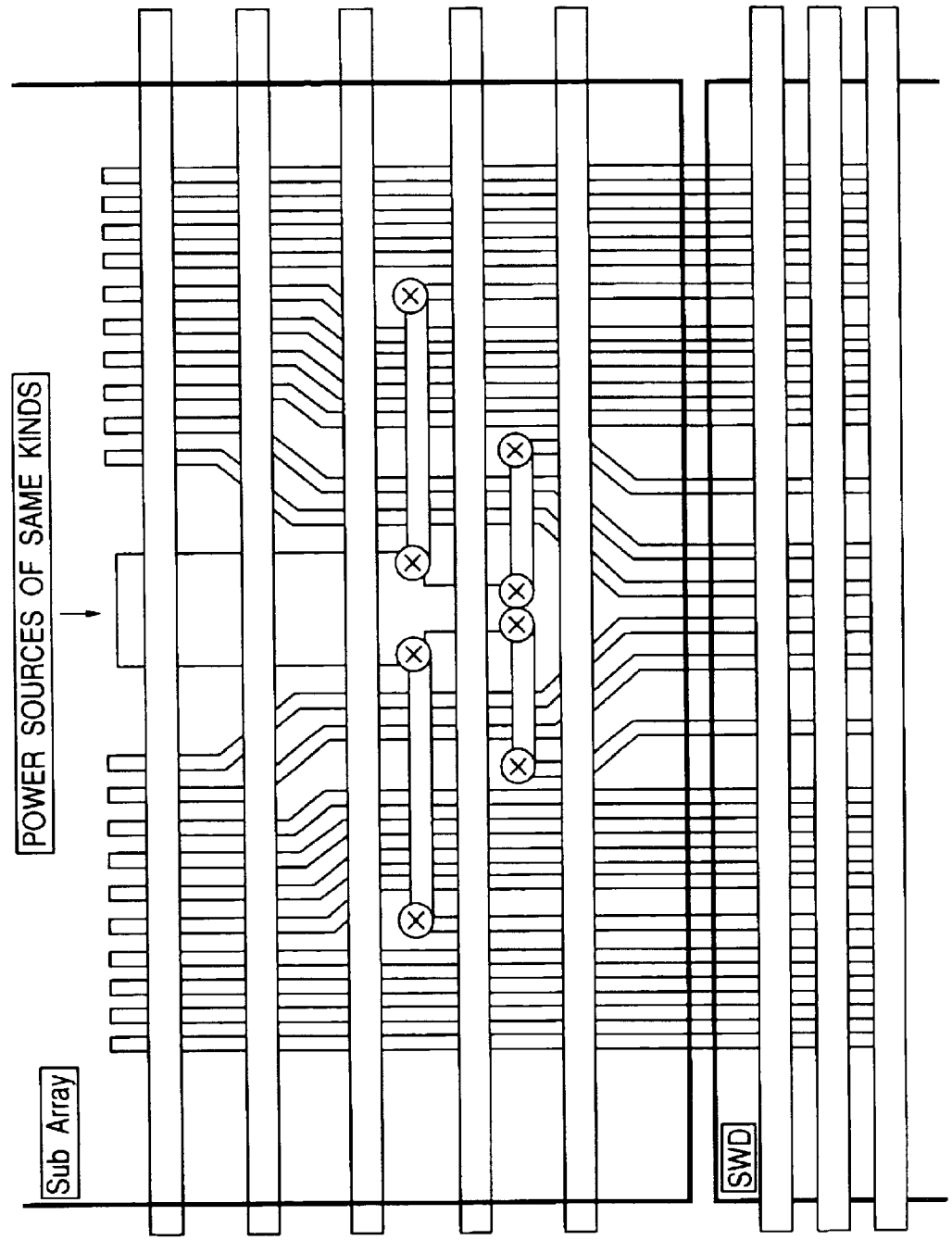
FIG. 12 is a schematic layout of upper wiring lines M2 and M3 showing still another example of memory array section in the dynamic RAM pertaining to the invention.

FIG. 12 is a schematic layout of upper wiring lines M2 and M3 showing still another example of memory array section in the dynamic RAM pertaining to the invention. Referring to FIG. 12, where there are a plurality of power supply lines of the same kind as shown in FIG. 9 above, they are placed together like the aforementioned sub-word selection lines FXB and arranged in a plurality of regular wiring widths to reduce the probability of fault occurrence. In this configuration, the spacing of wiring between the power supply lines and the respectively adjacent main word lines can be made even broader, and the probability of short circuiting fault between the main word lines and the power supply lines thereby intended to be lowered.

Thus, if short circuiting occurs between the raised voltage VPP and a main word line MWL as described above, replacement with a redundant main word line RMWL will be required. Therefore, reducing the probability of short circuiting fault occurrence as such between the main word line MWL and the source voltage VPP serves to make available the redundant main word line RMWL against any fault on another main word line and accordingly to enhance the efficiency of relief.

Figure 13:
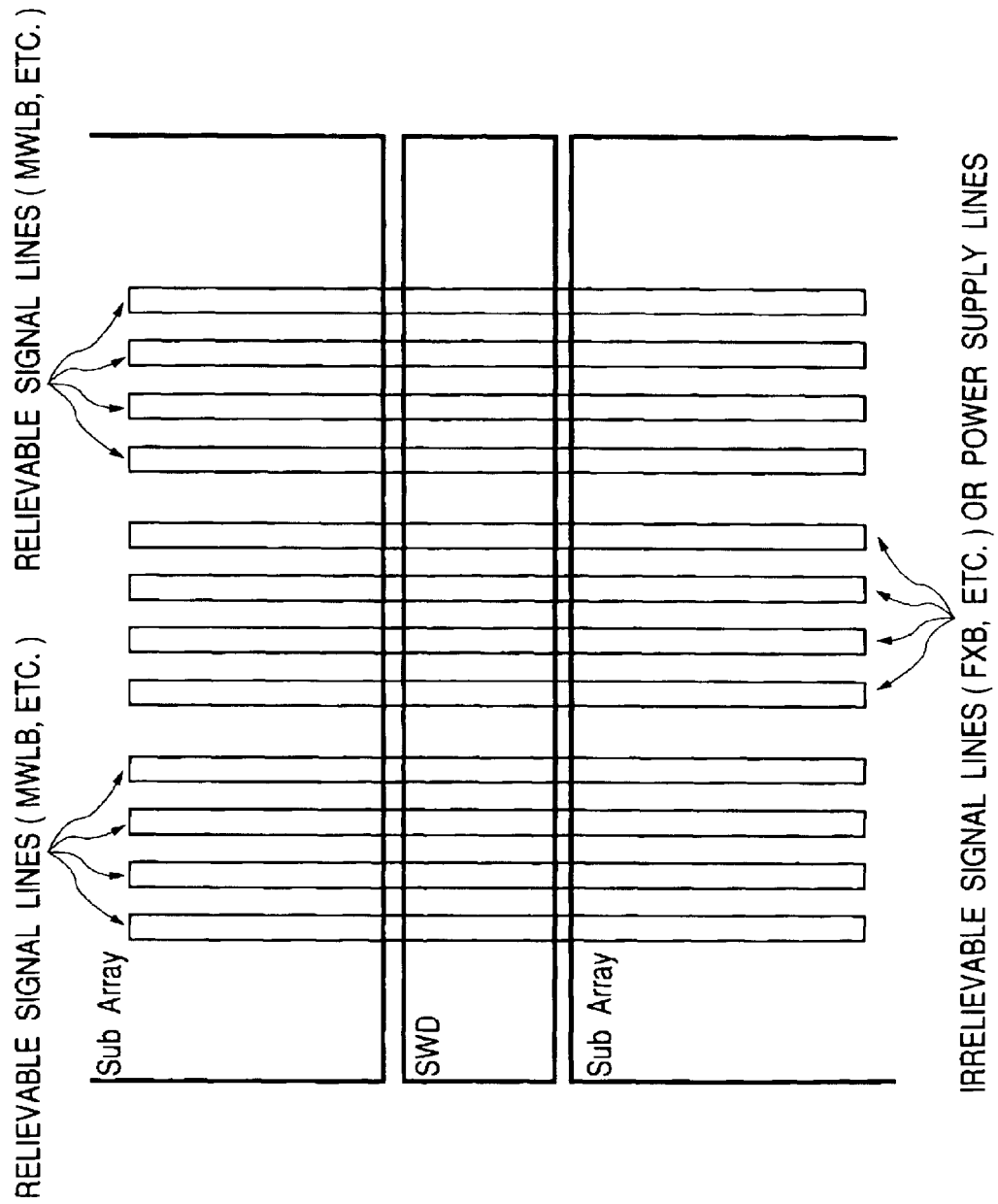
FIG. 13 is a schematic layout of upper wiring lines M2 and M3 showing yet another example of memory array section in the dynamic RAM pertaining to the invention.

FIG. 13 is a schematic layout of upper wiring lines M2 and M3 showing yet another example of memory array section in the dynamic RAM pertaining to the invention. Referring to FIG. 13, relievable signal lines, for instance the main word lines MWLB, are arranged in the same way as the sub-arrays and the sub-word drivers SWD, and irrelievable signal lies, for example the sub-word selection lines or power supply lines are arranged. In this configuration, the aforementioned cross wiring can be dispensed with in the memory cell array (sub-array) section adjoining sub-word drivers SWD, resulting in a simplified wiring pattern.

Figure 14:
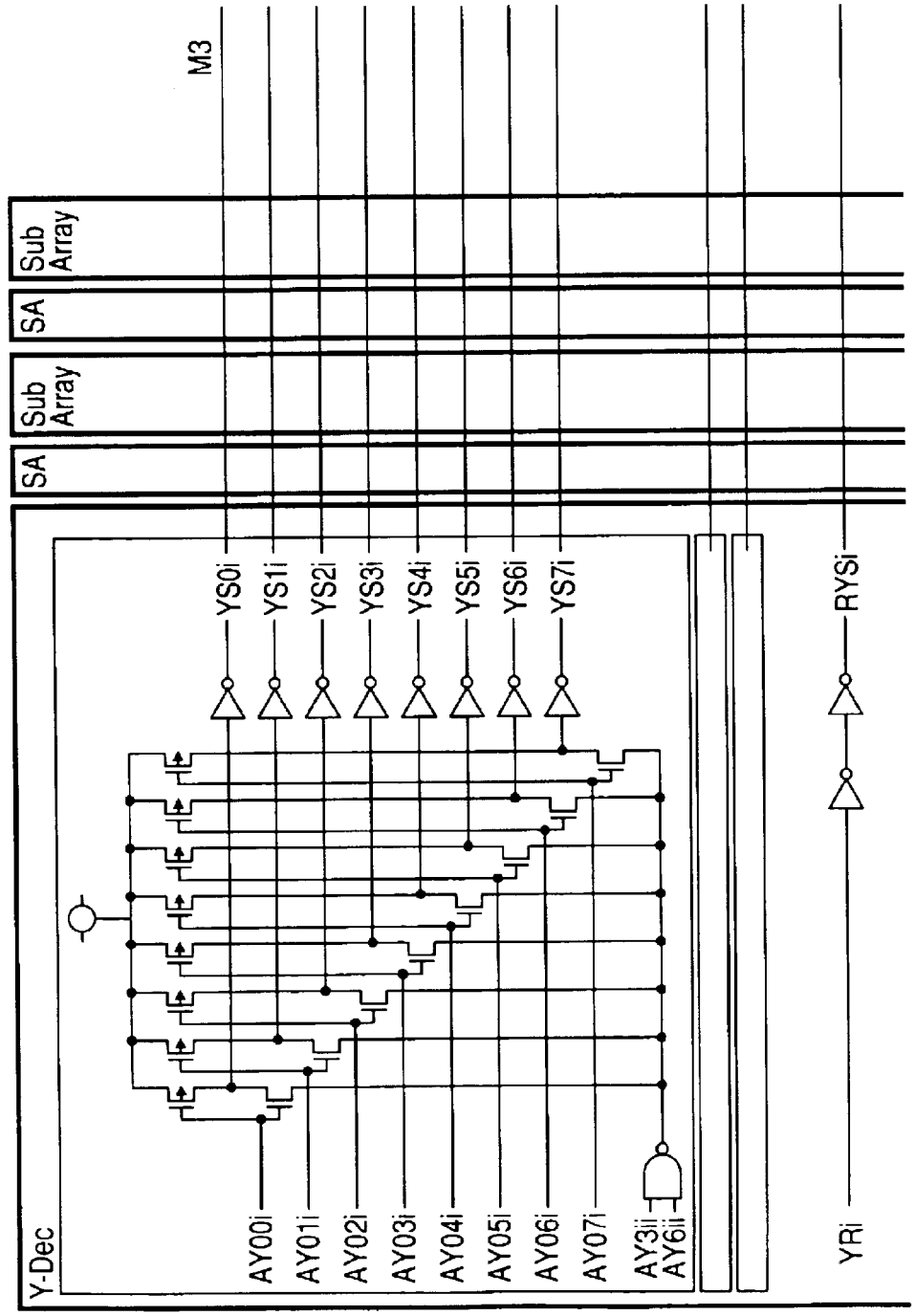
FIG. 14 is a schematic circuit diagram showing one example of Y-selector circuit in the dynamic RAM pertaining to the invention.

FIG. 14 is a schematic circuit diagram showing one example of Y-selector circuit in the dynamic RAM pertaining to the invention. A Y-decoder (Y-Dec) receives Y-pre-decode signals AY00*i* through AY07*i* formed of Y-address signals of the three least significant bits, and an inverter circuit actuated by an output signal of a gate circuit which receives pre-decode signals AY3*ii* and AY6*ii* formed by the remaining Y-address signals generates column selection signals. Such selection signals are conveyed to column selection lines YS0*i* through YS7*i* and the like via a column selection driver consisting of an inverter circuit. For column selection lines, too, redundant column selection lines RYSi are provided, and if there is a fault on any of the column selection lines or any bit line thereby selected, replacement with one of the redundant column selection lines RYS1 takes place.

Figure 15:
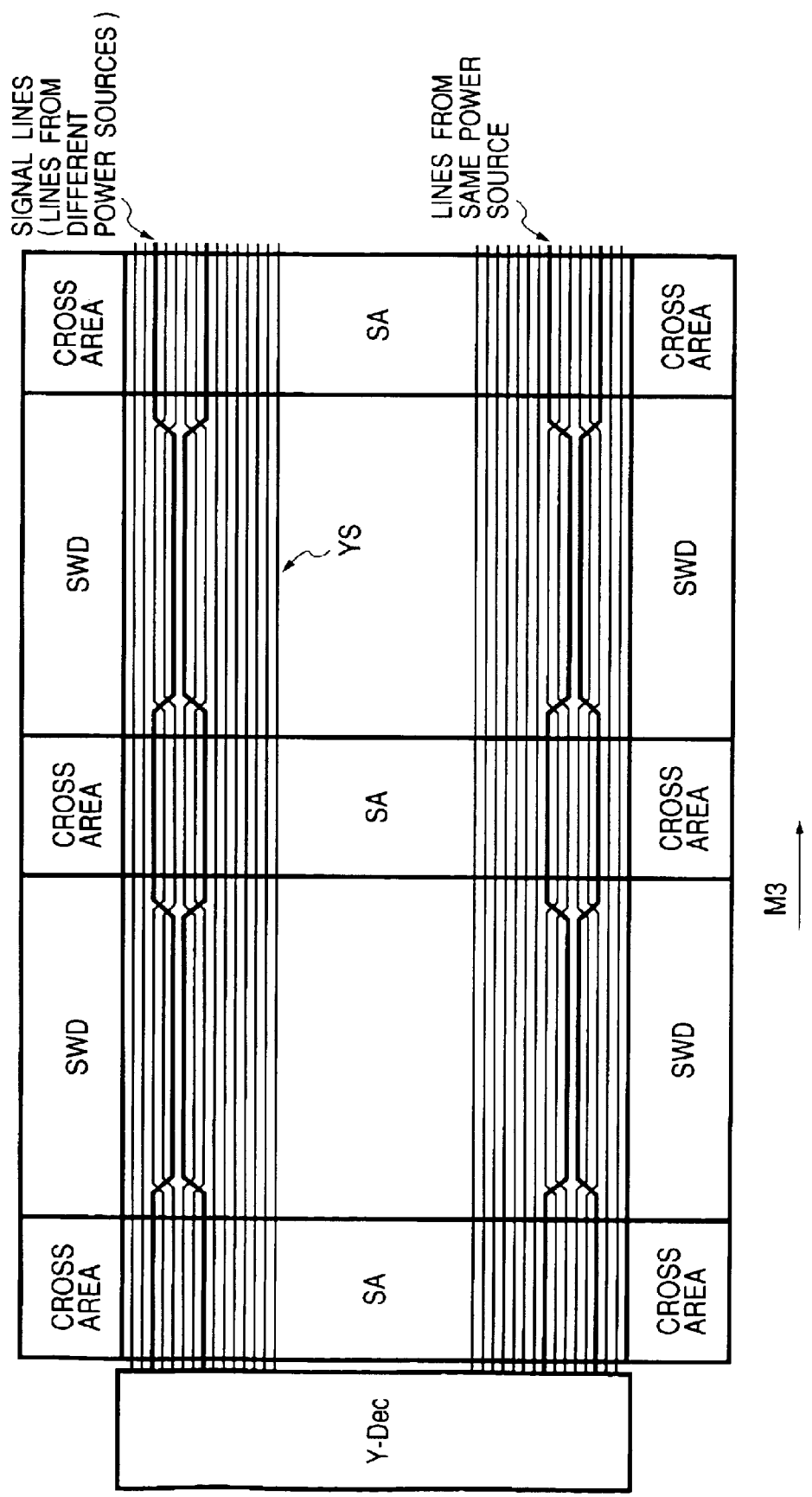
FIG. 15 is an arrangement diagram of upper wiring of another example of memory array section in the dynamic RAM pertaining to the invention.

FIG. 15 is an arrangement diagram of upper wiring of another example of memory array section in the dynamic RAM pertaining to the invention. By arranging redundant column selection lines RYSi for the column selection lines, too, as in the configuration shown in FIG. 14 above, relievable signal lines can be configured. On the other hand, since the power supply lines of different kinds, such as VSSA, VDL and VDDCLP, are irrelievable as is the operating voltage of the sense amplifiers, the power supply lines of different kinds are arranged adjacent to one another over the sub-array in order to increase the probability of fault occurrence.

The cross wiring parts shown in the sub-array sections adjoining the sense amplifiers SA are cross wiring parts like those shown in FIG. 10 and FIG. 11 above, though cross wiring in this case utilizes the second metal layer M2. Thus, conversely to the example shown in FIG. 9, power supply lines of different kinds are arranged adjoining one another by passing the power supply lines of different kinds underneath the column selection lines. In this example, too, the probability of fault occurrence can be reduced by separating relievable wiring and irrelievable wiring in arrangement.

Figure 16:
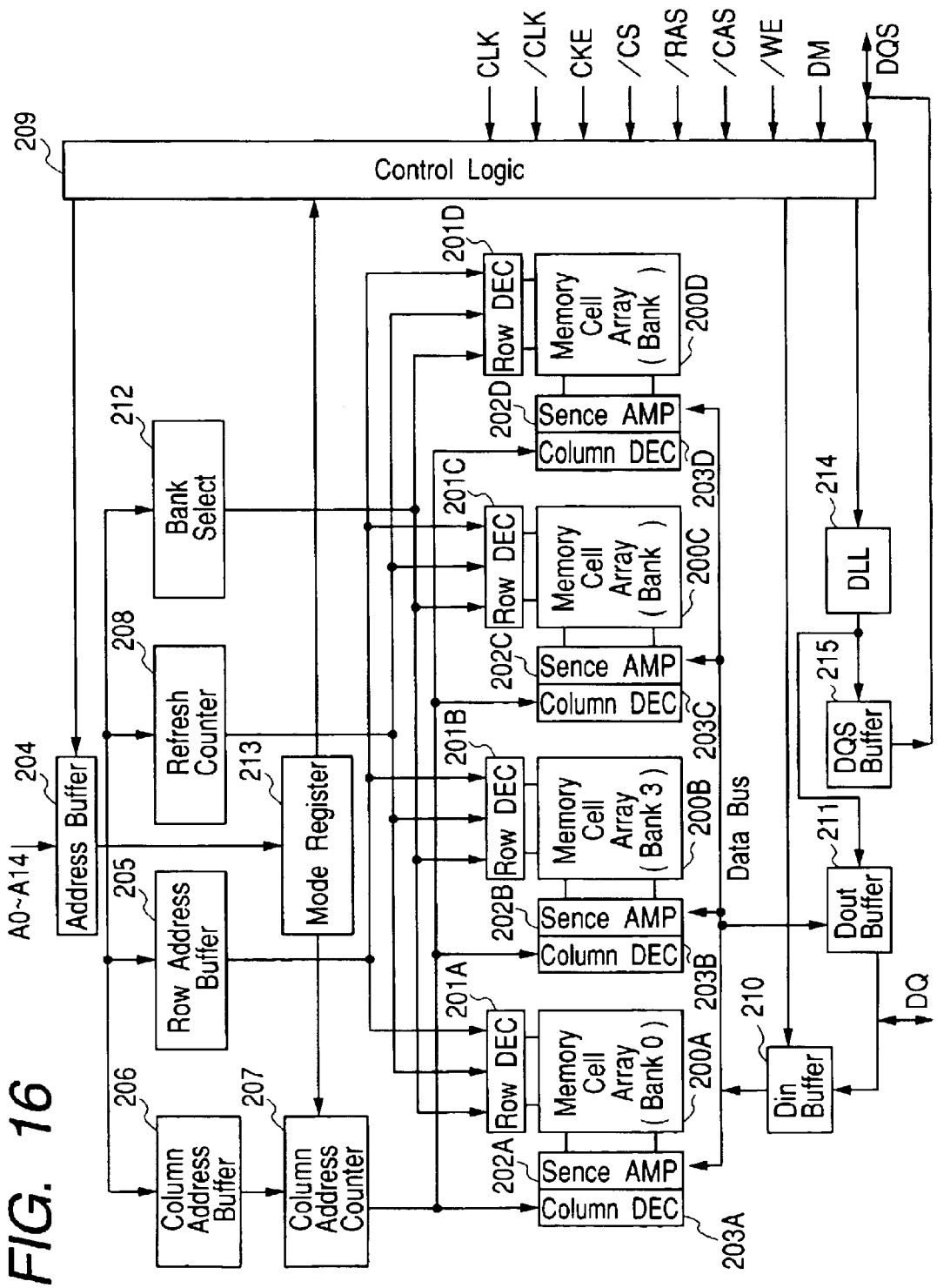
FIG. 16 is a block diagram of one example of dynamic RAM to which the invention is applicable.

FIG. 16 is a block diagram of one example of dynamic RAM to which the invention is applicable. The dynamic RAM in this example is directed towards a double data rate synchronous dynamic random access memory (DDR SDRAM). The DDR SDRAM in this case, though this is no particular limitation, is provided with four memory cell arrays 200A through 200D matching four memory banks as in the above-described example. The memory cell arrays 200A through 200D respectively matching the four memory banks 0 through 3 are provided with dynamic type memory cells arranged in a matrix and, with reference to the drawing, the selection terminals of memory cells arranged on the same column are coupled to the word lines (not shown) of the respective columns while the data input/output terminals of the memory cells arranged on the same row are coupled to complementary bit lines (not shown) of the respective rows.

One of the word lines (not shown) of the memory cell array 200A is driven to a selection level according to the result of decoding of the row address signal by a row decoder (Row DEC) 201A. Complementary data lines (not shown) of the memory cell array 200A are coupled to the I/O lines of a sense amplifier (Sense AMP) 202A and of a column selector circuit (Column DEC) 203A. The sense amplifier 202A is a circuit for amplifying micropotentials emerging on the respective complementary bit lines by the reading of data out of memory cells. The column selector circuit 203A in that includes a switch circuit for separately selecting the complementary bit lines and establishing their continuity to the complementary I/O lines. The column switch circuit is selectively operated according to the result of decoding of the column address signal by the column decoder 203A.

Similarly, the memory cell arrays 200B through 200D are also provided with row decoders 201B through 201D, sense amplifiers 203B through 203D and column selector circuits 203B through 203D, respectively. The complementary I/O line of each of the memory banks is connected to the output terminal of a data input circuit (Din Buffer) 210 having a write buffer and the input terminal of a data output circuit (Dout Buffer) 211, as the memory banks are communized via a data bus constituting the main input/output lines MIO. Though this is no particular limitation, a terminal DQ is supposed to be a data input/output terminal for inputting or outputting data D0 through D15 consisting of 16 bits. A DQS buffer 215 generates a data strobe signal for the data to be supplied from the terminal DQ in reading operation.

Address signals A0 through A14 supplied from an address input terminal are temporarily held by an address buffer 204; out of the address signals entered in a time series, row address signals are held by a row address buffer 205, while column address signals are held by a column address buffer 206. A refresh counter 208 generates row addresses for automatic refresh and self-refresh.

Where a storage capacity of 256 Mbits is available for instance, if the memory is to be accessed in two-bit units as column address signals, there is provided an address terminal for entering the address signal A14. In a ×4-bit configuration, up to the address signal A11 is supposed to be effective; in a ×8-bit configuration, up to the address signal A10 is supposed to be effective; and in a ×16-bit configuration, up to the address signal A9 is supposed to be effective. Where a storage capacity of 64 Mbits is available, in a ×4-bit configuration, up to the address signal A10 is supposed to be effective; in a ×8-bit configuration, up to the address signal A9 is supposed to be effective; and in a ×16-bit configuration, up to the address signal A8 is supposed to be effective.

The output of the column address buffer 206 is supplied as preset data for a column address counter 207, which supplies, in a burst mode designated by a command to be described afterwards or otherwise, the column decoders 203A through 203D with a column address signal as the preset data or values resulting from successive incrementing of the column address signal.

A mode register 213 holds information on various operation modes. Of the row decoders 201A through 201D, only what matches a bank designated by a bank select circuit 212 operates to perform, word line selection. A control circuit 209 is supplied with, though this is no particular limitation, external control signals including clock signals CLK and /CLK (a signal whose reference sign is marked with / is a row enable signal), a clock enable signal CKE, a chip select signal /CS, a column address strobe signal /CAS, a row address strobe signal /RAS, and a write enable signal /WE, /DM and DQS, and address signals via the mode register 213, and generates internal timing signals for controlling the operating mode of the DDR SDRAM and the operation of the aforementioned circuit block on the basis of level variations and timings of those signals, each provided with an input buffer matching one or another of the signals.

The clock signals CLK and /CLK are entered into a DLL circuit 214 via a clock buffer to generate an internal clock. This internal clock, though this is no particular limitation, is used as the input signal for the data output circuit 211 and the DQS buffer 215. The clock signal via the clock buffer is fed to a clock terminal which supplies the data input circuit 210 and the column address counter 207.

Other external input signals are made significant in synchronism with the leading edge of the pertinent internal clock signal. The chip select signal /CS instructs with its low level the start of a command input cycle. The chip select signal /CS is at its high level (a state of non-selection of chip) or any other input is insignificant. However, neither the state of memory bank selection to be described afterwards nor internal operations including the burst operation is affected by the state of non-selection of chip. The signals /RAS, /CAS and /WE differ in function from the respectively matching signals in a usual DRAM, and are made significant when defining a command cycle to be described afterwards.

The clock enable signal CKE is a signal to designate the validity of the next clock signal; if the pertinent signal CKE is at its high level, the leading edge of the next clock signal CLK will be validated, or at its low level, it will be invalidated. To add, if an external control signal /OE to exercise output enable control over the data output circuit 211 in the read mode is provided, this signal /OE is also supplied to the control circuit 209 and, if that signal is at its high level for instance, the data output circuit 211 is placed in a high output impedance state.

The row address signal is defined by the levels of A0 through A11 in a row address strobe bank active command cycle, to be described afterwards, synchronized with the leading edge of the clock signal CLK (internal clock signal).

The address signals A12 and A13 are deemed to be bank selection signals in the row address strobe bank active command cycle mentioned above. Thus one out of four memory banks 0 through 3 is selected according to the combination of A12 and A13. The control of selection of a memory bank can be accomplished by, though this is no particular limitation, processing to activate only the row decoders on the selected memory bank side, total non-selection of column switch circuits on the non-selected memory bank sides, to establish connection to the data input circuit 210 and the data output circuit only on the selected memory bank side or otherwise.

The column address signal, when in the ×16-bit configuration of 256 Mbits as mentioned above, is defined by the levels of A0 through A9 in a read or write command (column address/read command and column address/write command to be described afterwards) cycle synchronized with the leading edge of the clock signal CLK (internal clock). The column address so defined is made the start address of burst access.

In the DDR SDRAM, when a burst operation is taking place on one memory bank, it is possible to designate on the way of that operation another memory bank and when a row address strobe bank active command is supplied, to enable a row address-related operation to take place on that latter memory bank without affecting the operation on the former memory bank.

Therefore, unless for instance data D0–D15 run into collision at a data input/output terminal consisting of 16 bits, it is possible during the execution of a command whose processing is not yet completed, to issue a precharge command or a row address strobe bank active command on a memory bank different from the memory bank to undergo processing by the command under execution and start in advance an internal operation. As the DDR SDRAM in this example accesses memories in 16-bit units as stated above, has about 4M addresses under A0 through A11 addresses and is configured of four memory banks, it has total memory capacity of about 256 Mbits (4M×4 bank×16 bits).

The operation to read out of the DDR SDRAM will be detailed below. The chip select /CS, /RAS, /CAS and write enable /WE signals are entered in synchronism with the CLK signal. At the same time as /RAS becomes equal to 0, the row address and the bank selection signal are entered, and held by the row address buffer 205 and the bank select circuit 212, respectively. The row decoder 210 of the bank designated by the bank select circuit 212 decodes the row address signal, data on the whole row are supplied from the memory cell array 200 as micro-signals. The supplied micro-signals are amplified and held by the sense amplifiers 202. The designated bank is activated.

In 3CLK after the row address is entered, the column address and the bank selection signal are entered at the same time as CAS becomes equal to 0, and held by the column address buffer 206 and the bank select circuit 212, respectively. If the designated bank is active, the held column address is supplied from the column address counter 207, and the column decoders 203 select the column. The selected data are supplied from the sense amplifiers 202. The data then supplied are equivalent to two sets (8 bits if in the ×4-bit configuration, or 32 bits if in the ×16-bit configuration).

The data supplied from the sense amplifiers 202 are supplied outside the chip from the data output circuit 211 via the lines LIO–MIO, the main amplifier and the data bus. The output timing is synchronized with both the leading and trailing edges of QCLK supplied from the DLL circuit 214. Then, the two-set equivalent of data consisting of ODD and EVEN as mentioned above undergoes parallel-to-serial conversion to become data equivalent to 1 set×2. At the same time as the data output, the data strobe signal DQS is supplied from the DQS buffer 215. If the burst length stored in the mode register 213 is not less than 4, the column address counter 207 undergoes automatic address incrementing, and reads the next set of column data.

The role of the DLL circuit 214 is to generate operation clock signals for the data output circuit 211 and the DQS buffer 215. After the internal clock signals generated by the DLL circuit 214 are entered into the data output circuit 211 and the DQS buffer 215, it takes some time before data signals and data strobe signals are actually supplied. In view of this time gap, the phase of the data signals and the data strobe signals are made identical with an external clock CLK by advancing the phase of the internal clock signal ahead of the external clock CLK by using a suitable replica circuit. Therefore, the DQS buffer is placed in an output high impedance state except when it is in data output operation as described above.

When in write operation, since the DQS buffer 215 of the DDR SDRAM is in an output high impedance state, the data strobe signal DQS is entered into the terminal DQS from a data processing device, such as a microprocessor, and write data synchronized with it is entered into the terminal DQ. A data input circuit 210, as described above, serially take in the write data entered from the terminal DQ according to a clock signal formed on the basis of the data strobe signal entered from the terminal DQS, converts them into parallel data in synchronism with the clock signal CLK. The parallel data are conveyed to the selected memory bank via the data bus, and written into the selected memory cell on the memory bank.

By applying the present invention to the DDR SDRAM described above, it is made possible to configure semiconductor memories superior in product yield while reducing the memory chip size.

The advantages of the embodiment of the invention described above are as follows.

(1) With a simple configuration in which regular circuits and redundant circuits are provided, wherein a plurality of relievable first wiring lines constituting the regular circuits and a plurality of irrelievable second wiring lines are arranged on the same wiring layer in the same direction, and the irrelievable wiring lines are arranged adjacent to one another, an advantage of lowering the probability of fault occurrence can be achieved because the number of potential positions of relievable wiring being made irrelievable by short circuiting with irrelievable wiring can be reduced while enhancing the level of integration.

(2) In addition to the foregoing, the first wiring lines constituting the regular circuits consists of a plurality of main word lines extending in a first direction, and a plurality of sub-word line groups are provided, each group matching one or another of the plurality of main word lines; the plurality of second wiring lines constituting the regular circuits are provided in common for the plurality of sub-word line groups, and are a plurality of signal lines for selecting sub-word line out of one sub-word line group; both the plurality of main word lines and the plurality of signal lines are provided in a layer above the plurality of sub-word line groups over a semiconductor substrate; and two or more of the plurality of signal lines are adjacent to one another and extend in the first direction. This enables an advantage of lowering the probability of fault occurrence to be achieved while enhancing the level of integration by virtue of the hierarchical word line system.

(3) In addition to the foregoing, the plurality of first wiring lines constituting the regular circuits are first and second main word lines extending in a first direction; the first and second main word lines are respectively provided with first and second sub-word lines extending in the first direction and third and fourth sub-word lines extending in the first direction; the second wiring lines constituting the regular circuits comprise first signal lines provided to match the first and third sub-word lines and extending in the first direction and second signal lines provided to match the second and fourth sub-word lines and extending in the first direction; a plurality of bit lines are provided in a second direction crossing the first direction; memory cells are provided at the intersections between the first, second, third and fourth sub-word lines and the plurality of bit lines; a circuit for selecting one out of the first, second, third and fourth sub-word lines on the basis of signals on the first and second main word lines and signals on the first and second signal lines is provided; the first, second, third and fourth sub-word lines are arranged in a first layer over the semiconductor substrate; the first and second main word lines and the first and second signal lines are arranged in a second layer different from the first layer; and the first signal lines and second signal lines are arranged adjacent to each other. This enables an advantage of lowering the probability of fault occurrence to be achieved while enhancing the level of integration by virtue of the hierarchical word line system.

(4) In addition to the foregoing, the first signal lines and the first main word lines are arranged adjacent to each other, and the spacing between the first signal lines and the first main word lines is made wider than the spacing between the first signal lines and second signal lines, resulting in an advantage of lowering the probability of irrelievable fault occurrence between the first main word lines and the first signal lines.

(5) In addition to the foregoing, further provided with third signal lines, extending in the second direction, for conveying signals on the first signal lines to the circuit, and fourth signal lines, extending in the second direction, for conveying signals on the second signal lines to the circuit, resulting in an advantage of making possible circuit simplification because the first signal lines and second signal lines can be commonly used for selecting operations by a plurality of sub-word lines.

(6) In addition to the foregoing, the first signal lines and second signal lines are arranged distributively to sandwich between them one or a plurality of main word lines in an area where a circuit for selecting one of the sub-word lines is provided, and on the border between this area and an area in which the memory cells are arranged the first signal lines and second signal lines are arranged crossing the main word lines and adjoining each other, resulting in an advantage that laying out the wiring in the circuit for selecting one of the sub-word lines is facilitated.

(7) In addition to the foregoing, the redundant circuits are provided with redundant main word lines for relieving defects, and first redundant sub-word lines and second redundant sub-word lines provided to match the redundant main word lines, and one of the first and second redundant sub-word lines can be selected on the basis of signals on the redundant main word lines and signals on the first and second signal lines, resulting in an advantage that any fault arising on whether a main word line or a sub-word line can be relieved with a simple configuration.

(8) In addition to the foregoing, at least two each of memory array areas are provided in the first direction of a semiconductor chip and a second direction orthogonal thereto; each of the memory array areas comprises a plurality of memory cell array areas arranged in the first direction and second direction, including a plurality of bit lines disposed in the second direction, a plurality of main word lines and sub-word lines disposed in the first direction and a plurality of memory cells disposed matchingly in the intersections between the plurality of bit lines and the plurality of sub-word lines; a plurality each of memory cell array areas arranged in the first direction and the second direction; a plurality of sense amplifier areas arranged alternately with a plurality of memory cell array areas disposed in the second direction; and a plurality of sub-word driver areas arranged alternately with a plurality of memory cell array areas disposed in the first direction, wherein the sub-word drivers, receiving signals on the main word lines and signals on the first signal lines or second signal lines, generate a selection signal for sub-word lines, resulting in an advantage of realizing a memory circuit increased in integration level and operating speed and securing a greater margin of operation.

(9) In addition to the foregoing, the first wiring lines constituting the regular circuits are a plurality of main word lines extending in the first direction, and a plurality of sub-word line groups respectively matching the plurality of main word lines are provided; the second wiring lines constituting the regular circuits are power supply lines for supplying a prescribed D.C. voltage; both the plurality of main word lines and the plurality of power supply lines are provided in a layer above the plurality of sub-word line groups over semiconductor substrate; and two or more of the plurality of power supply lines adjoin each other and extend in the first direction, resulting in an advantage that the probability of fault occurrence can be lowered while reducing power supply impedance by meshing the power supply lines.

(10) In addition to the foregoing, the second wiring lines constituting the regular circuits are provided commonly for the plurality of sub-word line groups, and comprise a plurality of signal lines for selecting one sub-word line out of one sub-word line group, and power supply lines for supplying a prescribed D.C. voltage; both the plurality of main word lines and the plurality of signal lines are provided in a layer above the plurality of sub-word line groups over the semiconductor substrate; and two or more of the plurality of signal lines and the power supply line adjoin one another and extend in the first direction, resulting in an advantage that the probability of fault occurrence can be lowered while enhancing the level of integration by virtue of the hierarchical word line system and reducing power supply impedance by meshing the power supply lines.

(11) In addition to the foregoing, the plurality of power supply lines, among which what supply the same voltage are communized, are formed in a wiring width matching the commonized plurality of power supply lines, resulting in advantage that the probability of fault occurrence can be further lowered.

Although the invention by the present inventor has been described in specific terms with reference to an embodiment thereof, it goes without saying that the invention is not limited to this embodiment, but can be modified in various without deviating from its essentials. For instance, the first wiring and the second wiring constituting the regular circuits can be extensively utilized where a plurality of relievable wiring and a plurality of irrelievable wiring are extended on the same wiring layer in the same direction in the same way as the relationship among the main word lines, sub-word selection lines and power supply lines in a hierarchical word line system. The memory circuit may be what is made non-volatile using a ferroelectric capacitor as storage means instead of the aforementioned one using dynamic type memory cells. Alternatively, it may consist of non-volatile memory cells in which electric charges are accumulated at floating gates.

INDUSTRIAL APPLICABILITY

The present invention can be extensively applied to semiconductor integrated circuit devices provided with regular circuits and redundant circuits and the regular circuits include circuits in which relievable first wiring and irrelievable second wiring are extended on the same wiring layer in the same direction.

What is claimed is:

1. A semiconductor integrated circuit device comprising regular circuits and redundant circuits for use in relief of any fault arising in said regular circuits, wherein a plurality of relievable first wiring lines and a plurality of irrelievable second wiring lines constituting said regular circuits are arranged on the same wiring layer in the same direction, and wherein said plurality of second wiring lines are arranged adjacent to one another, and wherein the first wiring lines constituting said regular circuits comprise a plurality of main word lines extending in a first direction, and a plurality of sub-word line groups are provided, each group matching one or another of said plurality of main word lines, wherein said plurality of second wiring lines constituting said regular circuits are provided in common for said plurality of sub-word line groups, and are a plurality of signal lines for selecting a sub-word line out of one sub-word line group, wherein both said plurality of main word lines and said plurality of signal lines are provided in a layer above said plurality of sub-word line groups over a semiconductor substrate, and wherein two or more of said plurality of signal lines are adjacent to one another and extend in said first direction.

2. The semiconductor integrated circuit device according to claim 1, wherein at least two each of memory array areas are provided in said first direction of a semiconductor chip and a second direction orthogonal thereto, each of said memory array areas comprising:

a plurality of memory cell array areas arranged in said first direction and second direction, including a plurality of bit lines disposed in said second direction, a plurality of main word lines and sub-word lines disposed along said first direction, and a plurality of memory cells disposed to match to the intersections between said plurality of bit lines and said plurality of sub-word lines, said each of plural memory cell array areas arranged in said first direction and said second direction;

a plurality of sense amplifier areas arranged alternately; and a plurality of sub-word driver areas arranged alternately with a plurality of memory cell array areas disposed along said first direction, with sub-word drivers receiving signals on said main word lines and signals on said first signal lines or second signal lines, and generating a selection signal for sub-word lines.

3. A semiconductor integrated circuit device comprising regular circuits and redundant circuits for use in relief of any fault arising in said regular circuits, wherein a plurality of relievable first wiring lines and a plurality of irrelievable second wiring lines constituting said regular circuits are arranged on the same wiring layer in the same direction, and wherein said plurality of second wiring lines are arranged adjacent to one another, and wherein the plurality of first wiring lines constituting said regular circuits are first and second main word lines extending in a first direction, wherein said first main word lines are provided with first and second sub-word lines extending in said first direction, wherein said second main word lines are provided with third and fourth sub-word lines extending in said first direction, wherein the plurality of second wiring lines constituting said regular circuits comprise first signal lines provided to match said first and third sub-word lines and extending in said first direction and second signal lines provided to match said second and fourth sub-word lines and extending in said first direction, wherein a plurality of bit lines are provided in a second direction crossing said first direction, wherein memory cells are provided at the intersections between said first, second, third and fourth sub-word lines and said plurality of bit lines, wherein a circuit for selecting one out of said first, second, third and fourth sub-word lines on the basis of signals on said first and second main word lines and signals on said first and second signal lines is provided, wherein said first, second, third and fourth sub-word lines are arranged in a first layer over the semiconductor substrate, wherein said first and second main word lines and said first and second signal lines are arranged in a second layer different from said first layer, and wherein said first signal lines and second signal lines are arranged adjacent to each other.

4. The semiconductor integrated circuit device according to claim 3, wherein said first signal lines and said first main word lines are arranged adjacent to each other, and wherein the spacing between said first signal lines and said first main word lines is wider than the spacing between said first signal lines and second signal lines.

5. The semiconductor integrated circuit device according to claim 3, further comprising:

third signal lines, extending in said second direction, for conveying signals on said first signal lines to said circuit; and fourth signal lines, extending in said second direction, for conveying signals on said second signal lines to said circuit.

6. The semiconductor integrated circuit device according to claim 3, wherein said first signal lines and second signal lines are arranged distributively to sandwich one or a plurality of main word lines in an area where a circuit for selecting one of the sub-word lines is provided, and on the border between this area and an area in which said memory cells are arranged, said first signal lines and second signal lines are arranged crossing said main word lines and adjoining each other.

7. The semiconductor integrated circuit device according to claim 3, wherein said redundant circuits comprise:

redundant main word lines for relieving defects; and first redundant sub-word lines and second redundant sub-word lines provided to match said redundant main word lines, with one of said first and second redundant sub-word lines being capable of being selected on the basis of signals on said redundant main word lines and signals on said first and second signal lines.

8. A semiconductor integrated circuit device comprising regular circuits and redundant circuits for use in relief of any fault arising in said regular circuits, wherein a plurality of relievable first wiring lines and a plurality of irrelievable second wiring lines constituting said regular circuits are arranged on the same wiring layer in the same direction, and wherein said plurality of second wiring lines are arranged adjacent to one another, and wherein said plurality of first wiring lines are a plurality of main word lines extending in the first direction, and a plurality of sub-word line groups respectively matching said plurality of main word lines are provided, wherein said plurality of second wiring lines are power supply lines for supplying a prescribed D.C. voltage, wherein both said plurality of main word lines and said plurality of power supply lines are provided in a layer above said plurality of sub-word line groups over the semiconductor substrate, and wherein two or more of said plurality of power supply lines adjoin each other and extend in said first direction, and wherein the second wiring lines constituting said regular circuits are provided commonly for said plurality of sub-word line groups, and comprise a plurality of signal lines for selecting one sub-word line out of one sub-word line group, and power supply lines for supplying a prescribed D.C. voltage, wherein both said plurality of main word lines and said plurality of signal lines are provided in a layer above said plurality of sub-word line groups, over the semiconductor substrate, and wherein two or more of said plurality of signal lines and said power supply line adjoin one another and extend in said first direction.

9. The semiconductor integrated circuit device according to claim 8, wherein said plurality of power supply lines, among which supply the same voltage are communized, and are formed in a wiring width matching said communized plurality of power supply lines.

10. A semiconductor integrated circuit device comprising:

first and second wiring lines formed in a first layer and extending in a first direction; and third and fourth wiring lines formed in said first layer and extending in said first direction, wherein said first wiring lines and said second wiring lines are arranged adjoining each other, wherein said second wiring lines and said third wiring lines are arranged adjoining each other, wherein said third wiring lines and said fourth wiring lines are arranged adjoining each other, wherein said first and second wiring lines can be relieved more easily than said third and fourth wiring lines, and wherein the spacing between said first wiring lines and said second wiring lines is shorter than the spacing between said second wiring lines and said third wiring lines.

11. The semiconductor integrated circuit device according to claim 10, wherein the spacing between said first wiring lines and said second wiring lines is shorter than the spacing between said third wiring lines and said fourth wiring lines.

12. The semiconductor integrated circuit device according to claim 10, wherein the spacing between said second wiring lines and said third wiring lines is longer than the spacing between said third wiring lines and said fourth wiring lines.

13. The semiconductor integrated circuit device according to claim 10, wherein said first and said second wiring lines are word lines, and said third and fourth wiring lines are signal lines for selecting the word lines.

14. The semiconductor integrated circuit device according to claim 10, wherein said plurality of first and second wiring lines are relievable, and said third and fourth wiring lines are irrelievable.

15. The semiconductor integrated circuit device according to claim 10, wherein the semiconductor integrated circuit device includes a circuit for relieving said plurality of first and second wiring lines, but the semiconductor integrated circuit device does not include a circuit for relieving said third and fourth wiring lines.

16. A semiconductor integrated circuit device comprising:

first voltage wiring formed in a first layer, extending in a first direction and having a first sectional area;

a second voltage wiring formed in said first layer, extending in said first direction and having a second sectional area smaller than said first sectional area; and a third voltage wiring formed in said first layer, extending in said first direction and having a third sectional area smaller than said first sectional area, wherein said first voltage wiring, said second voltage wiring and said third voltage wiring are connected to one another, and wherein said first voltage wiring is arranged over a memory array having a plurality of memory cells, and said second voltage wiring and said third voltage wiring are arranged in other areas than said memory array.

17. The semiconductor integrated circuit device according to claim 16, wherein said second voltage wiring and said third voltage wiring are arranged in parallel, and wherein first wiring formed between said second voltage wiring and said third voltage wiring is further included.

18. The semiconductor integrated circuit device according to claim 16,
wherein said second sectional area and said third sectional area are equal.

19. The semiconductor integrated circuit device according to claim 16,
wherein said memory array includes a plurality of word lines connected to said memory cells, and
wherein said semiconductor integrated circuit device includes a drive circuit for driving said plurality of word lines, and said second voltage wiring and said third voltage wiring are arranged over said drive circuit.

20. A semiconductor integrated circuit device comprising:
a plurality of main word lines extending in a first direction;
a plurality of sub-word line groups provided to respectively match said plurality of main word lines; and
a plurality of signal lines, provided commonly for said plurality of sub-word line groups, for selecting one sub-word line out of one sub-word line group,
wherein both said plurality of main word lines and said plurality of signal lines are provided in a layer above said plurality of sub-word line groups, over the semiconductor substrate, and
wherein two or more of said plurality of signal lines adjoin each other and extend in said first direction.

21. A semiconductor integrated circuit device comprising:
first and second main word lines extending in a first direction;
first and second sub-word lines provided to match said first main word lines and extending in said first direction;
third and fourth sub-word lines provided to match said second main word lines and extending in said first direction;
first signal lines provided to match said first and third sub-word lines and extending in said first direction;
second signal lines provided to match said second and fourth sub-word lines and extending in said first direction;
a plurality of data lines extending in a second direction crossing said first direction;
memory cells provided at intersections of said first, second, third and fourth sub-word lines with said plurality of data lines; and
a circuit for selecting one out of said first, second, third and fourth sub-word lines on the basis of signals on said first and second main word lines and signals on said first and second signal lines,
wherein said first, second, third and fourth sub-word lines are provided in a first layer over a semiconductor substrate,
wherein said first and second main word lines and said first and second signal lines are provided in a second layer differing from said first layer, and
wherein said first signal lines and second signal lines are arranged adjoining each other.

22. The semiconductor integrated circuit device according to claim 21,
wherein said first signal lines and said first main word lines are arranged adjoining each other, and
wherein the spacing between said first signal lines and said first main word lines is wider than the spacing between said first signal lines and second signal lines.

23. The semiconductor integrated circuit device according to claim 21, further comprising:
third signal lines, extending in said second direction, for conveying signals on said first signal lines to said circuit; and
fourth signal lines, extending in said second direction, for conveying signals on said second signal lines to said circuit.

24. The semiconductor integrated circuit device according to claim 21, further comprising:
redundant main word lines for defect relieving use; and
first redundant sub-word lines and second redundant sub-word lines provided to match said redundant main word lines,
wherein one of said first and second redundant sub-word lines can be selected on the basis of signals on said redundant main word lines and signals on said first and second signal lines.

* * * * *